US012456604B2

(12) United States Patent
Ziemba et al.

(10) Patent No.: US 12,456,604 B2
(45) **Date of Patent: *Oct. 28, 2025**

(54) NANOSECOND PULSER RF ISOLATION FOR PLASMA SYSTEMS

(71) Applicant: Eagle Harbor Technologies, Inc., Seattle, WA (US)

(72) Inventors: Timothy Ziemba, Bainbridge Island, WA (US); Kenneth Miller, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 1010 days.

This patent is subject to a terminal disclaimer.

(21) Appl. No.: 17/214,772

(22) Filed: Mar. 26, 2021

(65) Prior Publication Data

US 2021/0351008 A1 Nov. 11, 2021

Related U.S. Application Data

(63) Continuation-in-part of application No. 17/133,612, filed on Dec. 23, 2020, now Pat. No. 11,527,383, and a continuation-in-part of application No. PCT/US2020/066990, filed on Dec. 23, 2020.

(60) Provisional application No. 62/953,259, filed on Dec. 24, 2019.

(51) Int. Cl.
*H01J 37/32* (2006.01)
*H03H 7/01* (2006.01)

(52) U.S. Cl.
CPC .. *H01J 37/32146* (2013.01); *H01J 37/32183* (2013.01); *H03H 7/0115* (2013.01)

(58) Field of Classification Search
CPC .......... H01J 37/32146; H01J 37/32495; H01J 37/32183; H01J 37/32174; H01J 37/32715; H01L 21/6831; H03H 7/0115
See application file for complete search history.

(56) References Cited

U.S. PATENT DOCUMENTS

| | | | |
|---|---|---|---|
| 2,710,933 | A | 6/1955 | Dion |
| 2,773,935 | A | 12/1956 | Trousdale |
| 2,832,832 | A | 4/1958 | Trousdale |

(Continued)

FOREIGN PATENT DOCUMENTS

| | | | |
|---|---|---|---|
| CA | 2292526 | A1 | 12/1999 |
| CN | 1602563 | A | 3/2005 |

(Continued)

OTHER PUBLICATIONS

Non Final Office Action in U.S. Appl. No. 16/178,538, dated Jan. 11, 2019, 27 pages.

(Continued)

*Primary Examiner* — Yuechuan Yu

(57) ABSTRACT

Embodiments of the invention include a plasma system. The plasma system includes a plasma chamber; an RF driver configured to drive bursts into the plasma chamber with an RF frequency; a nanosecond pulser configured to drive pulses into the plasma chamber with a pulse repetition frequency, the pulse repetition frequency being less than the RF frequency; a high pass filter disposed between the RF driver and the plasma chamber; and a low pass filter disposed between the nanosecond pulser and the plasma chamber.

8 Claims, 15 Drawing Sheets

(56) References Cited

U.S. PATENT DOCUMENTS

| | | | |
|---|---|---|---|
| 3,339,108 | A | 8/1967 | Holtje |
| 4,070,589 | A | 1/1978 | Martinkovic |
| 4,076,996 | A | 2/1978 | Maehara et al. |
| 4,438,331 | A | 3/1984 | Davis |
| 4,504,895 | A | 3/1985 | Steigerwald |
| 4,692,851 | A | 9/1987 | Attwood |
| 4,885,074 | A | 12/1989 | Susko et al. |
| 4,924,191 | A | 5/1990 | Erb et al. |
| 4,992,919 | A | 2/1991 | Lee et al. |
| 5,072,191 | A | 12/1991 | Nakajima et al. |
| 5,118,969 | A | 6/1992 | Ikezi et al. |
| 5,140,510 | A | 8/1992 | Myers |
| 5,313,481 | A | 5/1994 | Cook et al. |
| 5,321,597 | A | 6/1994 | Alacoque |
| 5,325,021 | A | 6/1994 | Duckworth et al. |
| 5,392,043 | A | 2/1995 | Ribner |
| 5,451,846 | A | 9/1995 | Peterson et al. |
| 5,483,731 | A | 1/1996 | Prendel et al. |
| 5,488,552 | A | 1/1996 | Sakamoto et al. |
| 5,610,452 | A | 3/1997 | Shimer et al. |
| 5,623,171 | A | 4/1997 | Nakajima |
| 5,654,679 | A | 8/1997 | Mavretic et al. |
| 5,656,123 | A | 8/1997 | Salimian et al. |
| 5,729,562 | A | 3/1998 | Birx et al. |
| 5,796,598 | A | 8/1998 | Nowak et al. |
| 5,808,504 | A | 9/1998 | Chikai et al. |
| 5,905,646 | A | 5/1999 | Crewson et al. |
| 5,917,286 | A | 6/1999 | Scholl et al. |
| 5,930,125 | A | 7/1999 | Hitchcock et al. |
| 5,933,335 | A | 8/1999 | Hitchcock et al. |
| 5,936,481 | A | 8/1999 | Fujii |
| 5,968,377 | A | 10/1999 | Yuasa et al. |
| 6,059,935 | A | 5/2000 | Spence |
| 6,066,901 | A | 5/2000 | Burkhart et al. |
| 6,086,730 | A | 7/2000 | Liu et al. |
| 6,087,871 | A | 7/2000 | Kardo-Syssoev et al. |
| 6,205,074 | B1 | 3/2001 | Van Buskirk et al. |
| 6,222,321 | B1 | 4/2001 | Scholl et al. |
| 6,233,161 | B1 | 5/2001 | Balakrishnan et al. |
| 6,238,387 | B1 | 5/2001 | Miller, III |
| 6,239,403 | B1 | 5/2001 | Dible et al. |
| 6,253,704 | B1 | 7/2001 | Savas |
| 6,300,720 | B1 | 10/2001 | Birx |
| 6,359,542 | B1 | 3/2002 | Widmayer et al. |
| 6,362,604 | B1 | 3/2002 | Cravey |
| 6,392,187 | B1 | 5/2002 | Johnson |
| 6,472,822 | B1 | 10/2002 | Chen et al. |
| 6,480,399 | B2 | 11/2002 | Balakrishnan et al. |
| 6,483,731 | B1 | 11/2002 | Isurin et al. |
| 6,496,047 | B1 | 12/2002 | Iskander et al. |
| 6,518,195 | B1 | 2/2003 | Collins et al. |
| 6,577,135 | B1 | 6/2003 | Matthews et al. |
| 6,741,120 | B1 | 5/2004 | Tan |
| 6,741,484 | B2 | 5/2004 | Crewson et al. |
| 6,831,377 | B2 | 12/2004 | Yampolsky et al. |
| 6,897,574 | B2 | 5/2005 | Vaysee |
| 6,942,813 | B2 | 9/2005 | Ying et al. |
| 6,947,300 | B2 | 9/2005 | Pai et al. |
| 7,061,230 | B2 | 6/2006 | Kleine et al. |
| 7,180,082 | B1 | 2/2007 | Hassanein et al. |
| 7,256,637 | B2 | 8/2007 | Iskander et al. |
| 7,291,545 | B2 | 11/2007 | Collins et al. |
| 7,307,375 | B2 | 12/2007 | Smith et al. |
| 7,319,579 | B2 | 1/2008 | Inoue et al. |
| 7,354,501 | B2 | 4/2008 | Gondhalekar et al. |
| 7,393,765 | B2 | 7/2008 | Hanawa et al. |
| 7,396,746 | B2 | 7/2008 | Walther et al. |
| 7,492,138 | B2 | 2/2009 | Zhang et al. |
| 7,512,433 | B2 | 3/2009 | Bernhart et al. |
| 7,521,370 | B2 | 4/2009 | Hoffman |
| 7,549,461 | B2 | 6/2009 | Kroliczek et al. |
| 7,601,619 | B2 | 10/2009 | Okumura et al. |
| 7,605,385 | B2 | 10/2009 | Bauer |
| 7,615,931 | B2 | 11/2009 | Hooke et al. |
| 7,767,433 | B2 | 8/2010 | Kuthi et al. |
| 7,901,930 | B2 | 3/2011 | Kuthi et al. |
| 7,936,544 | B2 | 5/2011 | Beland |
| 7,943,006 | B2 | 5/2011 | Hoffman |
| 7,948,185 | B2 | 5/2011 | Smith et al. |
| 7,989,987 | B2 | 8/2011 | McDonald |
| 8,093,797 | B2 | 1/2012 | Tyldesley |
| 8,093,979 | B2 | 1/2012 | Wilson |
| 8,115,343 | B2 | 2/2012 | Sanders et al. |
| 8,120,207 | B2 | 2/2012 | Sanders et al. |
| 8,129,653 | B2 | 3/2012 | Kirchmeier et al. |
| 8,143,790 | B2 | 3/2012 | Smith et al. |
| 8,222,936 | B2 | 7/2012 | Friedman et al. |
| 8,259,476 | B2 | 9/2012 | Ben-Yaakov et al. |
| 8,436,602 | B2 | 5/2013 | Sykes |
| 8,450,985 | B2 | 5/2013 | Gray et al. |
| 8,471,642 | B2 | 6/2013 | Hill |
| 8,500,963 | B2 | 8/2013 | Ye et al. |
| 8,575,843 | B2 | 11/2013 | Moore et al. |
| 8,723,591 | B2 | 5/2014 | Lee et al. |
| 8,773,184 | B1 | 7/2014 | Petrov et al. |
| 8,847,433 | B2 | 9/2014 | Vandermey |
| 8,963,377 | B2 | 2/2015 | Ziemba et al. |
| 9,067,788 | B1 | 6/2015 | Spielman et al. |
| 9,070,396 | B1 | 6/2015 | Katchmart et al. |
| 9,084,334 | B1 | 7/2015 | Gefter et al. |
| 9,122,350 | B2 | 9/2015 | Kao et al. |
| 9,122,360 | B2 | 9/2015 | Xu et al. |
| 9,287,086 | B2 | 3/2016 | Brouk et al. |
| 9,287,092 | B2 | 3/2016 | Heckman et al. |
| 9,306,533 | B1 | 4/2016 | Mavretic |
| 9,329,256 | B2 | 5/2016 | Dolce |
| 9,417,739 | B2 | 8/2016 | Cordeiro et al. |
| 9,435,029 | B2 | 9/2016 | Brouk et al. |
| 9,493,765 | B2 | 11/2016 | Krishnaswamy et al. |
| 9,515,633 | B1 | 12/2016 | Long et al. |
| 9,601,283 | B2 | 3/2017 | Ziemba et al. |
| 9,655,221 | B2 | 5/2017 | Ziemba et al. |
| 9,706,630 | B2 | 7/2017 | Miller et al. |
| 9,729,122 | B2 | 8/2017 | Mavretic |
| 9,767,988 | B2 | 9/2017 | Brouk et al. |
| 9,881,772 | B2 | 1/2018 | Marakhatanov et al. |
| 9,960,763 | B2 | 5/2018 | Miller et al. |
| 9,966,231 | B2 | 5/2018 | Boswell et al. |
| 10,009,024 | B2 | 6/2018 | Gan et al. |
| 10,020,800 | B2 | 7/2018 | Prager et al. |
| 10,027,314 | B2 | 7/2018 | Prager et al. |
| 10,217,608 | B2 | 2/2019 | Mavretic |
| 10,224,822 | B2 | 3/2019 | Miller et al. |
| 10,301,587 | B2 | 5/2019 | Krishnaswamy et al. |
| 10,304,661 | B2 | 5/2019 | Ziemba et al. |
| 10,373,755 | B2 | 8/2019 | Prager et al. |
| 10,373,804 | B2 | 8/2019 | Koh et al. |
| 10,382,022 | B2 | 8/2019 | Prager et al. |
| 10,448,494 | B1 | 10/2019 | Dorf et al. |
| 10,460,910 | B2 | 10/2019 | Ziemba et al. |
| 10,460,911 | B2 | 10/2019 | Ziemba et al. |
| 10,483,089 | B2 | 11/2019 | Ziemba et al. |
| 10,483,090 | B2 | 11/2019 | Bhutta et al. |
| 10,510,575 | B2 | 12/2019 | Kraus et al. |
| 10,555,412 | B2 | 2/2020 | Dorf et al. |
| 10,607,814 | B2 | 3/2020 | Ziemba et al. |
| 10,631,395 | B2 | 4/2020 | Sanders et al. |
| 10,659,019 | B2 | 5/2020 | Slobodov et al. |
| 10,707,864 | B2 | 7/2020 | Miller et al. |
| 10,734,906 | B2 | 8/2020 | Miller et al. |
| 10,777,388 | B2 | 9/2020 | Ziemba et al. |
| 10,796,887 | B2 | 10/2020 | Prager et al. |
| 10,811,230 | B2 | 10/2020 | Ziemba et al. |
| 10,876,241 | B2 | 12/2020 | Hu et al. |
| 10,892,140 | B2 | 1/2021 | Ziemba et al. |
| 10,896,809 | B2 | 1/2021 | Ziemba et al. |
| 10,903,047 | B2 | 1/2021 | Ziemba et al. |
| 10,978,955 | B2 | 4/2021 | Ziemba et al. |
| 11,004,660 | B2 | 5/2021 | Prager et al. |
| 11,302,518 | B2 | 4/2022 | Prager et al. |
| 11,670,484 | B2 | 6/2023 | Prager et al. |
| 2001/0008552 | A1 | 7/2001 | Harada et al. |
| 2001/0023822 | A1 | 9/2001 | Koizumi et al. |
| 2002/0016617 | A1 | 2/2002 | Oldham |

(56) References Cited

U.S. PATENT DOCUMENTS

2002/0140464 A1 10/2002 Yampolsky et al.
2002/0180276 A1 12/2002 Sakuma et al.
2002/0186577 A1 12/2002 Kirbie
2003/0021125 A1 1/2003 Rufer et al.
2003/0054647 A1 3/2003 Suemasa et al.
2003/0071035 A1 4/2003 Brailove
2003/0137791 A1 7/2003 Arnet et al.
2003/0169107 A1 9/2003 LeChevalier
2004/0085784 A1 5/2004 Salama et al.
2004/0149217 A1 8/2004 Collins et al.
2004/0173570 A1 9/2004 Ying et al.
2004/0253486 A1 12/2004 Chen et al.
2004/0263412 A1 12/2004 Pribyl
2005/0152159 A1 7/2005 Isurin et al.
2005/0219302 A1 10/2005 Vogeley
2005/0270096 A1 12/2005 Coleman
2006/0048894 A1 3/2006 Yamazaki et al.
2006/0187607 A1 8/2006 Mo
2006/0192774 A1 8/2006 Yasumura
2006/0210020 A1 9/2006 Takahashi et al.
2006/0274887 A1 12/2006 Sakamoto et al.
2007/0018504 A1 1/2007 Weiner et al.
2007/0114981 A1 5/2007 Vasquez et al.
2007/0115705 A1 5/2007 Gotzenberger et al.
2007/0212811 A1 9/2007 Hanawa et al.
2007/0235412 A1 10/2007 Fischer
2008/0062733 A1 3/2008 Gay
2008/0099039 A1 5/2008 Krassnitzer et al.
2008/0099326 A1 5/2008 Ye et al.
2008/0106151 A1 5/2008 Ryoo et al.
2008/0143260 A1 6/2008 Tuymer et al.
2008/0198634 A1 8/2008 Scheel et al.
2008/0231337 A1 9/2008 Krishnaswamy et al.
2008/0252225 A1 10/2008 Kurachi et al.
2008/0272706 A1 11/2008 Kwon et al.
2009/0016549 A1 1/2009 French et al.
2009/0078678 A1 3/2009 Kojima et al.
2009/0108759 A1 4/2009 Tao et al.
2009/0194508 A1 8/2009 Ui et al.
2009/0211898 A1 8/2009 Chen et al.
2009/0255800 A1 10/2009 Koshimizu
2009/0298287 A1* 12/2009 Shannon ........... H01J 37/32091 438/758
2010/0007358 A1 1/2010 Schaerrer et al.
2010/0148847 A1 6/2010 Schurack et al.
2010/0252729 A1 10/2010 Jolliffe et al.
2010/0284208 A1 11/2010 Nguyen et al.
2011/0001438 A1 1/2011 Chemel et al.
2011/0140607 A1 6/2011 Moore et al.
2011/0177694 A1 7/2011 Chen et al.
2011/0223750 A1 9/2011 Hayashi et al.
2011/0248633 A1 10/2011 Nauman et al.
2011/0309748 A1 12/2011 Xia
2012/0016282 A1 1/2012 Van Brunt et al.
2012/0052599 A1 3/2012 Brouk et al.
2012/0081350 A1 4/2012 Sano et al.
2012/0129301 A1 5/2012 Or-Bach et al.
2012/0155613 A1 6/2012 Caiafa et al.
2012/0228263 A1 9/2012 Ui et al.
2013/0024784 A1 1/2013 Lifton
2013/0027848 A1 1/2013 Said
2013/0059448 A1 3/2013 Marakhatanov et al.
2013/0075390 A1 3/2013 Ashida
2013/0092529 A1 4/2013 Singh et al.
2013/0113650 A1 5/2013 Behbahani et al.
2013/0174105 A1 7/2013 Nishio et al.
2013/0175575 A1 7/2013 Ziemba et al.
2013/0213935 A1 8/2013 Liao et al.
2013/0228550 A1* 9/2013 Mori ........................ H03H 7/40 216/61
2014/0009969 A1 1/2014 Yuzurihara et al.
2014/0021180 A1 1/2014 Vogel
2014/0077611 A1 3/2014 Young et al.
2014/0109886 A1 4/2014 Singleton et al.
2014/0118414 A1 5/2014 Seo et al.
2014/0146571 A1 5/2014 Ryoo et al.
2014/0268968 A1 9/2014 Richardson
2014/0354343 A1 12/2014 Ziemba et al.
2015/0028932 A1 1/2015 Ziemba et al.
2015/0076372 A1 3/2015 Ziemba et al.
2015/0084509 A1 3/2015 Yuzurihara et al.
2015/0130525 A1 5/2015 Miller et al.
2015/0155086 A1 6/2015 Matsuura
2015/0206716 A1 7/2015 Kim et al.
2015/0256086 A1 9/2015 Miller et al.
2015/0288335 A1 10/2015 Hoyerby
2015/0303914 A1 10/2015 Ziemba et al.
2015/0311680 A1 10/2015 Burrows et al.
2015/0318846 A1 11/2015 Prager et al.
2016/0020070 A1 1/2016 Kim et al.
2016/0020072 A1 1/2016 Brouk et al.
2016/0020672 A1 1/2016 Shuck et al.
2016/0182001 A1 6/2016 Zeng et al.
2016/0220670 A1 8/2016 Kalghatgi et al.
2016/0241234 A1 8/2016 Mavretic
2016/0269195 A1 9/2016 Coenen et al.
2016/0327029 A1 11/2016 Ziemba et al.
2016/0327089 A1 11/2016 Adam et al.
2016/0358755 A1 12/2016 Long et al.
2017/0083810 A1 3/2017 Ielmini et al.
2017/0104469 A1 4/2017 Mavretic
2017/0126049 A1 5/2017 Pan et al.
2017/0154726 A1 6/2017 Prager et al.
2017/0243731 A1 8/2017 Ziemba et al.
2017/0294842 A1 10/2017 Miller et al.
2017/0311431 A1 10/2017 Park
2017/0314133 A1 11/2017 Kim et al.
2017/0330729 A1 11/2017 Mavretic
2017/0359886 A1 12/2017 Binderbauer et al.
2017/0366173 A1 12/2017 Miller et al.
2018/0041183 A1 2/2018 Mavretic et al.
2018/0226896 A1 8/2018 Miller et al.
2018/0286636 A1 10/2018 Ziemba et al.
2018/0315583 A1 11/2018 Luere et al.
2018/0331655 A1 11/2018 Prager et al.
2018/0374689 A1 12/2018 Abraham et al.
2019/0074806 A1 3/2019 Scott et al.
2019/0080884 A1 3/2019 Ziemba et al.
2019/0103253 A1 4/2019 Lill et al.
2019/0131110 A1 5/2019 Ziemba et al.
2019/0157044 A1 5/2019 Ziemba et al.
2019/0157980 A1 5/2019 Ji et al.
2019/0172683 A1 6/2019 Mavretic et al.
2019/0172685 A1 6/2019 Van Zyl et al.
2019/0180982 A1 6/2019 Brouk et al.
2019/0228952 A1 7/2019 Dorf et al.
2019/0236426 A1 8/2019 Zhang et al.
2019/0277804 A1 9/2019 Prager et al.
2019/0295821 A1 9/2019 Shoeb et al.
2019/0326092 A1 10/2019 Ogasawara et al.
2019/0348258 A1 11/2019 Koh et al.
2019/0350072 A1* 11/2019 Dorf ................ H01J 37/32174
2019/0393791 A1 12/2019 Ziemba et al.
2020/0035457 A1 1/2020 Ziemba et al.
2020/0035458 A1 1/2020 Ziemba et al.
2020/0037468 A1 1/2020 Ziemba et al.
2020/0043702 A1 2/2020 Ziemba et al.
2020/0051786 A1 2/2020 Ziemba et al.
2020/0144030 A1 5/2020 Prager et al.
2020/0168437 A1 5/2020 Ziemba et al.
2020/0176221 A1 6/2020 Prager et al.
2021/0013874 A1 1/2021 Miller et al.
2021/0091759 A1 3/2021 Prager et al.
2021/0152163 A1 5/2021 Miller et al.
2021/0399721 A1 12/2021 Prager et al.
2021/0408917 A1 12/2021 Miller et al.
2022/0020566 A1 1/2022 Slobodov et al.

FOREIGN PATENT DOCUMENTS

CN 101043784 A 9/2007
CN 101447163 A 6/2009
CN 101534071 A 9/2009
CN 101647183 A 2/2010

(56) References Cited

FOREIGN PATENT DOCUMENTS

| | | | |
|---|---|---|---|
| CN | 101689498 | A | 3/2010 |
| CN | 103222344 | A | 7/2013 |
| CN | 104254187 | A | 12/2014 |
| CN | 105099212 | A | 11/2015 |
| CN | 103458600 | B | 7/2016 |
| CN | 106537776 | A | 3/2017 |
| CN | 107070228 | A | 8/2017 |
| CN | 108093551 | A | 5/2018 |
| EP | 174164 | A2 | 3/1986 |
| EP | 0947048 | A1 | 10/1999 |
| EP | 1128557 | A2 | 8/2001 |
| EP | 1143497 | A1 | 10/2001 |
| EP | 1515430 | A1 | 3/2005 |
| FR | 2771563 | A1 | 5/1999 |
| JP | H09129621 | A | 5/1997 |
| JP | H09330915 | A | 12/1997 |
| JP | H11224796 | A | 8/1999 |
| JP | 2000268996 | A | 9/2000 |
| JP | 2005506660 | A | 3/2005 |
| JP | 2005203491 | A | 7/2005 |
| JP | 2009187975 | A | 8/2009 |
| JP | 2009263778 | A | 11/2009 |
| JP | 2010504614 | A | 2/2010 |
| JP | 2010532549 | A | 10/2010 |
| JP | 2011211168 | A | 10/2011 |
| JP | 2012205339 | A | 10/2012 |
| JP | 5429391 | B2 | 2/2014 |
| JP | 2015097433 | A | 5/2015 |
| JP | 2016046951 | A | 4/2016 |
| JP | 2018535504 | A | 11/2018 |
| KR | 20010080047 | A | 8/2001 |
| KR | 20180052772 | A | 5/2018 |
| SE | 9101281 | L | 10/1991 |
| TW | 200732488 | A | 9/2007 |
| TW | 200739723 | A | 10/2007 |
| TW | I355212 | B | 12/2011 |
| TW | 201515525 | A | 4/2015 |
| TW | 201737338 | A | 10/2017 |
| WO | 9738479 | A1 | 10/1997 |
| WO | 9811655 | A1 | 3/1998 |
| WO | 0193419 | A1 | 12/2001 |
| WO | 2008044633 | A1 | 4/2008 |
| WO | 2010069317 | A1 | 6/2010 |
| WO | 2011052653 | A1 | 5/2011 |
| WO | 2014036000 | A1 | 3/2014 |
| WO | 2016171582 | A1 | 10/2016 |
| WO | 2017126662 | A1 | 7/2017 |
| WO | 2017201209 | A1 | 11/2017 |
| WO | 2018186901 | A1 | 10/2018 |
| WO | 2019148010 | A1 | 8/2019 |

OTHER PUBLICATIONS

Non Final Office Action in U.S. Appl. No. 16/250,765, dated Mar. 29, 2019, 11 pages.

Notice of Allowance in U.S. Appl. No. 15/921,650 dated Apr. 4, 2019, 7 pages.

Non Final Office Action in U.S. Appl. No. 16/178,565, dated Apr. 4, 2019, 10 pages.

Final Office Action in U.S. Appl. No. 16/178,565, dated Jul. 12, 2019, 11 pages.

International Search Report and Written Opinion as issued in connection with International Patent Application No. PCT/US2019/043933, mailed Oct. 25, 2019, 9 pages.

Notice of Allowance in U.S. Appl. No. 16/178,565, dated Nov. 14, 2019, 5 pages.

International Search Report and Written Opinion as issued in connection with International Patent Application No. PCT/US2019/043932, mailed Dec. 5, 2019, 16 pages.

International Search Report and Written Opinion as issued in connection with International Patent Application No. PCT/US2019/043988, mailed Dec. 10, 2019, 13 pages.

Non Final Office Action in U.S. Appl. No. 16/250,157 dated Dec. 19, 2019, 6 pages.

International Search Report and Written Opinion as issued in connection with International Patent Application No. PCT/US2019/046067, mailed Jan. 3, 2020, 13 pages.

Notice of Allowance in U.S. Appl. No. 16/525,357, dated Jan. 14, 2020, 8 pages.

Non-Final Office Action in U.S. Appl. No. 16/523,840, dated Mar. 19, 2020, 6 pages.

Restriction Requirement in U.S. Appl. No. 16/537,513, dated Apr. 1, 2020, 7 pages.

International Search Report and Written Opinion as issued in connection with International Patent Application No. PCT/US2019/013988, mailed Apr. 9, 2020, 4 pages.

Notice of Allowance in US Application No. 16/250, 157 dated Apr. 13, 2020, 8 pages.

Non-Final Office Action in U.S. Appl. No. 16/524,950, dated Apr. 16, 2020, 8 pages.

International Search Report and Written Opinion as issued in connection with International Patent Application No. PCT. JS2020/016253, mailed Apr. 29, 2020, 7 pages.

Restriction Requirement in U.S. Appl. No. 16/524,967, dated Apr. 29, 2020, 6 pages.

Non-Final Office Action in U.S. Appl. No. 16/722,115, dated May 14, 2020, 6 pages.

International Search Report and Written Opinion as issued in connection with International Patent Application No. PCT/US2020/012641, mailed May 28, 2020, 15 pages.

Non Final Office Action in U.S. Appl. No. 16/697,173, dated Jun. 26, 2020, 19 pages.

Final Office Action in U.S. Appl. No. 16/523,840, dated Jun. 26, 2020, 5 pages.

Non Final Office Action in U.S. Appl. No. 16/779,270, dated Jul. 16, 2020, 9 pages.

Notice of Allowance in U.S. Appl. No. 16/524,967, dated Jul. 17, 2020, 11 pages.

Notice of Allowance in U.S. Appl. No. 16/779,270, dated Aug. 10, 2020, 6 pages.

Non Final Office Action in U.S. Appl. No. 16/537,513, dated Sep. 3, 2020, 13 pages.

International Search Report and Written Opinion as issued in connection with International Patent Application No. PCT/US2020/040579, mailed Sep. 30, 2020, 10 pages.

Notice of Allowance in U.S. Appl. No. 16/523,840, dated Sep. 30, 2020, 11 pages.

Notice of Allowance in U.S. Appl. No. 16/779,270, dated Oct. 8, 2020, 5 pages.

International Search Report and Written Opinion as issued in connection with International Patent Application No. PCT/US2020/034427, mailed Oct. 16, 2020, 9 pages.

Notice of Allowance in U.S. Appl. No. 16/524,950, dated Oct. 19, 2020, 9 pages.

Notice of Allowance in U.S. Appl. No. 16/524,950, dated Nov. 16, 2020, 9 pages.

Final Office Action in U.S. Appl. No. 16/722,115, dated Dec. 2, 2020, 7 pages.

Notice of Allowance in U.S. Appl. No. 16/523,840, dated Dec. 4, 2020, 11 pages.

Final Office Action in U.S. Appl. No. 16/537,513, dated Jan. 7, 2021, 12 pages.

Notice of Allowance in U.S. Appl. No. 16/524,926, dated Jan. 15, 2021, 9 pages.

International Search Report and written opinion received for PCT Patent Application No. PCT/US2020/60799, mailed in Feb. 5, 2021, 11 pages.

Notice of Allowance in U.S. Appl. No. 16/697,173, dated Feb. 9, 2021, 13 pages.

Notice of Allowance in U.S. Appl. No. 16/848,830, dated Feb. 19, 2021, 8 pages.

Notice of Allowance in U.S. Appl. No. 16/722,115, dated Apr. 1, 2021, 9 pages.

Advisory Action in U.S. Appl. No. 16/537,513, dated Apr. 22, 2021, 5 pages.

(56) References Cited

OTHER PUBLICATIONS

Notice of Allowance in U.S. Appl. No. 16/721,396, dated Apr. 23, 2021, 10 pages.
Non-Final Office Action in U.S. Appl. No. 16/722,115, dated May 3, 2021, 9 pages.
International Search Report and Written Opinion as issued in connection with International Patent Application No. PCT/US2020/066990, mailed May 5, 2021, 9 pages.
Notice of Allowance in U.S. Appl. No. 16/848,830, dated May 13, 2021, 6 pages.
Notice of Reason for Refusal for JP Patent Application No. 2021-504454, mailed on Jul. 20, 2021, 8 pages.
International Preliminary Report On Patentability dated Aug. 12, 2021 in PCT Application No. PCT/US2020/016253, 07 pages.
Non-Final Office Action in U.S. Appl. No. 16/937,948, dated Aug. 24, 2021, 10 pages.
Restriction Requirement in U.S. Appl. No. 17/133,612, dated Aug. 26, 2021, 5 pages.
First Office Action in CN Patent application No. 202080048240.2 dated Jun. 27, 2024, 22 pages.
Office Action in TW Patent application No. 112101449 dated Jul. 5, 2024, 11 pages.
Final Office Action in U.S. Appl. No. 18/328,411, dated Jun. 21, 2024, 11 pages.
Notice of Allowance in U.S. Appl. No. 17/359,498, dated Oct. 12, 2022, 09 pages.
Final Office Action in U.S. Appl. No. 17/231,931, dated Jan. 20, 2023, 19 pages.
Non Final Office Action in U.S. Appl. No. 17/366,000, dated Feb. 16, 2023, 13 pages.
Notice of Reason for Refusal for JP Patent Application No. 2023-063348, mailed on Mar. 9, 2023, 8 pages.
Notice of Allowance in U.S. Appl. No. 17/231,931 dated Mar. 29, 2023, 8 pages.
Notice of Reason for Refusal for JP Patent Application No. 2021-577859, mailed on Jun. 13, 2023, 14 pages.
Notice of Allowance in U.S. Appl. No. 17/366,000, dated Jul. 14, 2023, 9 pages.
International Search Report and Written Opinion as issued in connection with International Patent Application No. PCT/US2023/069316, mailed Sep. 5, 2023, 08 pages.
Notice of Reason for Refusal for JP Patent Application No. 2023-063348, mailed on Nov. 14, 2023, 12 pages.
Office Action in KR Patent application No. 2021-7020469 dated Nov. 24, 2023, 15 pages.
Non-Final Office Action in U.S. Appl. No. 18/328,411, dated Dec. 21, 2023, 16 pages.
First Office Action in CN Patent application No. 201980090264.1 dated Jan. 8, 2024, 18 pages.
Office Action in KR Patent application No. 2021-7027810 dated Feb. 15, 2024, 14 pages.
Decision of Refusal for JP Patent Application No. 2023-063348, mailed on Apr. 2, 2024, 7 pages.
Office Action in KR Patent application No. 2023-7028274 dated Apr. 19, 2024, 4 pages.
Office Action in KR Patent application No. 2023-7029360 dated Apr. 19, 2024, 10 pages.
Extended European Search Report for Application No. 21803769.5, 5 pages.
Non-Final Office Action in U.S. Appl. No. 17/133,612 dated Feb. 1, 2022, 7 pages.
Goodman, E. A., "Characteristics of sheet windings in transformers", IEEE Engineering, vol. 82, No. 11, pp. 673-676 (Nov. 1963) (Abstract).
Prager, J.R. et al., "A High Voltage Nanosecond Pulser with Variable Pulse Width and Pulse Repetition Frequency control For Nonequilibrium Plasma Applications", 41st International Conference on Plasma Sciences held with 2014 IEEE International Conference on High-Power Particle Beams, May 25-29, 2014, 6, Washington, D.C.
Advisory Action in U.S. Appl. No. 14/542,487 dated Mar. 28, 2017, 03 pages.
Non-Final Office Action in U.S. Appl. No. 15/889,586 dated Sep. 12, 2018, 18 pages.
International Search Report and Written Opinion as issued in connection with International Patent Application No. PCT/US2018/048206, mailed Nov. 1, 2018, 10 pages.
Notice of Allowance in U.S. Appl. No. 16/114,195, dated Apr. 3, 2019, 9 pages.
Final Office Action in U.S. Appl. No. 15/889,586 dated May 2, 2019, 19 pages.
Final Office Action in U.S. Appl. No. 15/941,731, dated May 3, 2019, 16 pages.
Final Office Action in U.S. Appl. No. 16/178,538 dated Jun. 7, 2019, 17 pages.
Notice of Allowance in U.S. Appl. No. 16/250,765, dated Jul. 10, 2019, 9 pages.
Notice of Allowance in U.S. Appl. No. 16/178,538 dated Jul. 17, 2019, 10 pages.
Notice of Allowance in U.S. Appl. No. 15/941,731, dated Jul. 17, 2019, 12 pages.
Non-Final Office Action in U.S. Appl. No. 15/889,586 dated Sep. 6, 2019, 17 pages.
Non Final Office Action in U.S. Appl. No. 15/945,722, dated Nov. 15, 2019, 13 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Notice of Allowance in U.S. Appl. No. 15/945,722, dated Apr. 3, 2020, 7 pages.
Non-Final Office Action in U.S. Appl. No. 16/736,971, dated Apr. 7, 2020, 14 pages.
Non-Final Office Action in U.S. Appl. No. 16/457,791 dated Apr. 15, 2020, 12 pages.
Final Office Action in U.S. Appl. No. 16/736,971, dated Apr. 17, 2020, 6 pages.
Advisory Action in U.S. Appl. No. 16/736,971, dated May 12, 2020, 5 pages.
Non-Final Office Action in U.S. Appl. No. 16/555,948, dated May 15, 2020, 8 pages.
Extended European Search Report for Application No. 18848041.2, 9 pages.
Notice of Allowance in U.S. Appl. No. 16/736,971, dated Jun. 30, 2020, 14 pages.
Advisory Action in U.S. Appl. No. 15/889,586 dated Jul. 10, 2020, 4 pages.
Notice of Allowance in U.S. Appl. No. 16/722,085, dated Jul. 16, 2020, 8 pages.
Final Office Action in U.S. Appl. No. 16/599,318, dated Jul. 23, 2020, 14 pages.
Notice of Allowance in U.S. Appl. No. 16/599,318, dated Aug. 4, 2020, 8 pages.
Non-Final Office Action in U.S. Appl. No. 15/889,586 dated Sep. 18, 2020, 19 pages.
Non Final Office Action in U.S. Appl. No. 16/903,374, dated Nov. 25, 2020, 16 pages.
Notice of Allowance in U.S. Appl. No. 16/555,948, dated Jan. 13, 2021, 7 pages.
Notice of Allowance in U.S. Appl. No. 16/457,791 dated Jan. 22, 2021, 7 pages.
Extended European Search Report for Application No. 20195265.2, 8 pages.
Notice of Allowance in U.S. Appl. No. 15/889,586 dated Apr. 14, 2021, 9 pages.
Non Final Office Action in U.S. Appl. No. 16/941,532, dated Apr. 14, 2021, 10 pages.
Extended European Search Report for Application No. 20200919.7, 11 pages.
Non-Final Office Action in U.S. Appl. No. 15/889,586 dated Jun. 11, 2021, 11 pages.

(56) References Cited

OTHER PUBLICATIONS

Non Final Office Action in U.S. Appl. No. 17/231,931, dated Sep. 9, 2022, 13 pages.
Non Final Office Action in U.S. Appl. No. 16/919,085, dated Sep. 29, 2021, 19 pages.
Notice of Allowance in U.S. Appl. No. 16/722,115 dated Oct. 4, 2021, 9 pages.
Notice of Allowance in U.S. Appl. No. 16/537,513, dated Oct. 8, 2021, 10 pages.
Final Office Action in U.S. Appl. No. 16/937,948, dated Nov. 22, 2021, 05 pages.
Final Office Action in U.S. Appl. No. 16/919,085, dated Jan. 18, 2022, 23 pages.
Non Final Office Action in U.S. Appl. No. 17/366,000, dated Mar. 3, 2022, 8 pages.
Notice of Allowance in U.S. Appl. No. 16/937,948 dated Apr. 28, 2022, 6 pages.
Non-Final Office Action in U.S. Appl. No. 17/359,498, dated Jun. 29, 2022, 7 pages.
Final Office Action in U.S. Appl. No. 17/366,000, dated Sep. 6, 2022, 8 pages.
Notice of Allowance in U.S. Appl. No. 17/133,612 dated Sep. 8, 2022, 10 pages.
Notice of Allowance in U.S. Appl. No. 17/234,773, dated Sep. 14, 2022, 09 pages.
Bland, M.J., et al., "A High Power RF Power Supply for High Energy Physics Applications," Proceedings of 2005 the Particle Accelerator Conference, IEEE pp. 4018-4020 (May 16-20, 2005).
Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).
Garwin, R., "Pulsed Power Peer Review Committee Report," Sandia National Laboratories Report, SAND2000-2515, pp. 3-38 (Oct. 2000).
Gaudet, J.A., et al, "Research issues in Developing Compact Pulsed Power for High Peak Power Applications on Mobile Platforms," Proceedings of the IEEE, vol. 92, No. 7, pp. 1144-1165 (Jul. 2004).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Pustylnik, M., et al., "High-voltage nanosecond pulses in a low-pressure radiofrequency discharge", Physical Review E, vol. 87, No. 6, pp. 1-9 (2013).
Quinley, M., et al., "High Voltage Nanosecond Pulser Operating at 30 kW and 400 kHz" APS-GEC-2018, 1 page (2018).
Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modern Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A. and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, mailed Sep. 15, 2014, 10 pages.
International Search Report and Written Opinion as issued in connection with International Patent Application No. PCT/US2014/065832, mailed Feb. 20, 2015, 13 pages.
International Search Report and Written Opinion as issued in connection with International Patent Application No. PCT/US2015/018349, mailed Jul. 14, 2015, 15 pages.
International Search Report and Written Opinion as issued in connection with International Patent Application No. PCT/US2015/040204, mailed Oct. 6, 2015, 12 pages.
Non-Final Office Action in U.S. Appl. No. 14/542,487 dated Nov. 23, 2015, 11 pages.
Non-Final Office Action in U.S. Appl. No. 14/798,154 dated Jan. 5, 2016, 13 pages.
Final Office Action in U.S. Appl. No. 14/542,487 dated Feb. 12, 2016, 11 pages.
Non-Final Office Action in U.S. Appl. No. 14/542,487 dated Apr. 8, 2016, 12 pages.
Non Final Office Action in U.S. Appl. No. 14/635,991, dated Jul. 29, 2016, 17 pages.
Final Office Action in U.S. Appl. No. 14/798,154 dated Oct. 6, 2016, 14 pages.
Final Office Action in U.S. Appl. No. 14/542,487 dated Dec. 12, 2016, 13 pages.
Final Office Action in U.S. Appl. No. 14/635,991, dated Jan. 23, 2017, 22 pages.
Notice of Allowance in U.S. Appl. No. 14/635,991, dated May 4, 2017, 07 pages.
Non-Final Office Action in U.S. Appl. No. 14/798,154 dated May 26, 2017, 16 pages.
Non-Final Office Action in U.S. Appl. No. 14/542,487 dated Jun. 5, 2017, 12 pages.
Partial Supplementary European Search Report in related foreign application No. 14861818.4, 12 Pages.
Non Final Office Action in U.S. Appl. No. 15/623,464, dated Nov. 7, 2017, 18 pages.
Final Office Action in U.S. Appl. No. 14/542,487 dated Dec. 19, 2017, 07 pages.
Final Office Action in U.S. Appl. No. 14/798,154 dated Dec. 28, 2017, 06 pages.
Notice of Allowance in U.S. Appl. No. 14/542,487 dated Mar. 21, 2018, 05 pages.

(56) References Cited

OTHER PUBLICATIONS

Final Office Action in U.S. Appl. No. 15/623,464, dated Mar. 27, 2018, 18 pages.
International Search Report and Written Opinion as issued in connection with International Patent Application No. PCT/US2018/016993, mailed Apr. 18, 2018, 11 pages.
Notice of Allowance in U.S. Appl. No. 14/798,154 dated Jun. 1, 2018, 05 pages.
International Search Report and Written Opinion as issued in connection with International Patent Application No. PCT/US2018/025440, mailed Jun. 25, 2018, 25 pages.
Notice of Allowance in U.S. Appl. No. 15/623,464, dated Oct. 17, 2018, 7 pages.
Non Final Office Action in U.S. Appl. No. 15/941,731, dated Nov. 16, 2018, 17 pages.
Non-Final Office Action in U.S. Appl. No. 15/921,650 dated Nov. 28, 2018, 11 pages.
Notice of Allowance in U.S. Appl. No. 18/328,411, dated Sep. 30, 2024, 9 pages.

* cited by examiner

NANOSECOND PULSER RF ISOLATION FOR PLASMA SYSTEMS

BACKGROUND

The semiconductor device fabrication process uses plasma processing at different stages to manufacture semiconductor devices. These semiconductor devices may include a processors, a memory, integrated circuits, and other types integrated circuits and devices. Various other process utilize plasma processing. Plasma processing involves energizing a gas mixture by imparting energy to the gas molecules by introducing RF (radio frequency) energy into the gas mixture. This gas mixture is typically contained in a vacuum chamber, referred to as a plasma chamber, and the RF energy is typically introduced into the plasma chamber through electrodes.

In a typical plasma process, the RF generator generates power at a radio frequency, which is broadly understood as being within the range of 3 kHz and 300 GHz, and this power is transmitted through RF cables and networks to the plasma chamber. In order to provide efficient transfer of power from the RF generator to the plasma chamber, an intermediary circuit is used to match the fixed impedance of the RF generator with the variable impedance of the plasma chamber. Such an intermediary circuit is commonly referred to as an RF impedance matching network, or more simply as a matching network.

SUMMARY

Some embodiments of the invention include a plasma system. The plasma system includes a plasma chamber; an RF driver configured to drive bursts into the plasma chamber with an RF frequency; a nanosecond pulser configured to drive pulses into the plasma chamber with a pulse repetition frequency, the pulse repetition frequency being less than the RF frequency; a high pass filter disposed between the RF driver and the plasma chamber; and a low pass filter disposed between the nanosecond pulser and the plasma chamber.

In some embodiments, the high pass filter may include a capacitor. In some embodiments, the low pass filter may include an inductor. In some embodiments, the RF driver may comprise a nanosecond pulser.

Some embodiments of the invention include plasma system. The plasma system includes a plasma chamber may include a plurality of walls and a wafer support. When a plasma is created within the plasma chamber a wall-plasma sheath is formed between the plasma and the at least one of the plurality of walls, and a wafer-plasma sheath is formed between the plasma and a wafer disposed on the wafer support. The capacitance of the wall-plasma sheath is at least about ten times greater than the capacitance of the wafer-plasma sheath. An RF driver drives bursts into the plasma chamber with an RF frequency. A nanosecond pulser drives pulses into the plasma chamber with a pulse repetition frequency, the pulse repetition frequency being less than the RF frequency. A first filter disposed between the RF driver and the plasma chamber. A second filter disposed between the nanosecond pulser and the plasma chamber.

In some embodiments, the capacitance of the wafer-plasma sheath is less than about 1 nF. In some embodiments, the RF driver drives bursts with a peak voltage greater than about 1 kV and with a frequency greater than about 1 Mhz. In some embodiments, the nanosecond pulser drives pulses with a peak voltage greater than about 1 kV and with a frequency less than the frequency of the bursts produced by the RF generator. In some embodiments, the first filter comprises a high pass filter and wherein the second filter comprises a low pass filter. In some embodiments, the second filter comprises a capacitor coupled with ground. In some embodiments, the capacitor has a capacitance less than about 500 pF.

Some embodiments of the invention include plasma system. The plasma system includes a plasma chamber may include a plasma chamber; an RF driver electrically coupled with the plasma chamber that drives bursts into the plasma chamber with an RF frequency; a nanosecond pulser electrically coupled with the plasma chamber that drives pulses into the plasma chamber with a pulse repetition frequency, the pulse repetition frequency being less than the RF frequency; a capacitor disposed between the RF driver and the plasma chamber; and an inductor disposed between the nanosecond pulser and the plasma chamber.

In some embodiments, the capacitor has a capacitance less than about 100 pF. In some embodiments, the inductor has an inductance less than about 10 nH. In some embodiments, the inductor has a stray capacitance less than about 5 pF.

In some embodiments, the plasma chamber comprises a plurality of walls and a wafer support such that when a plasma is created within the plasma chamber a wall-plasma sheath is formed between the plasma and the at least one of the plurality of walls, and a wafer-plasma sheath is formed between the plasma and a wafer disposed on the wafer support, wherein the capacitance of the wall-plasma sheath is at least about ten times greater than the capacitance of the wafer-plasma sheath.

In some embodiments, the plasma chamber comprises a plurality of walls and a wafer support such that when a plasma is created within the plasma chamber a wall-plasma sheath is formed between the plasma and the at least one of the plurality of walls, and a wafer-plasma sheath is formed between the plasma and a wafer disposed on the wafer support, wherein the capacitance of the wall-plasma sheath is at least about fifty times greater than the capacitance of the wafer-plasma sheath.

Some embodiments of the invention include plasma system. The plasma system includes a plasma chamber may include a plasma chamber; an RF driver configured to drive pulses into the plasma chamber with an RF frequency greater than about 200 kHz and peak voltages greater than 1 kV; an energy sink circuit electrically coupled with the plasma chamber; a rectifying diode electrically coupled between the plasma chamber and the RF driver such that the rectifying diode rectifies waveforms produced by the RF driver; and a droop control inductor and a droop resistance arranged in series such that the series combination of the droop control inductor and the droop control resistor are arranged in parallel with the rectifying diode.

In some embodiments, the energy sink circuit comprises a resistive output stage circuit. In some embodiments, the energy sink circuit comprises an energy recovery circuit. In some embodiments, the droop control inductor has an inductance less than about 10 mH. In some embodiments, the droop resistance is less than about 500Ω.

These embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

A plasma system is disclosed. The plasma system includes a plasma chamber; an RF driver configured to drive RF bursts into the plasma chamber with an RF frequency; a nanosecond pulser configured to drive pulses into the plasma chamber with a pulse repetition frequency, the pulse repetition frequency being less than the RF frequency; a high pass filter disposed between the RF driver and the plasma chamber; and a low pass filter disposed between the nanosecond pulser and the plasma chamber.

Figure 1A:
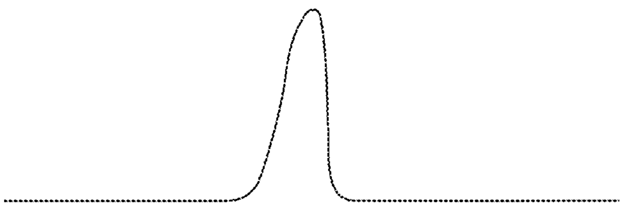
FIG. 1A shows a pulse from a nanosecond pulser according to some embodiments.
Figure 1B:
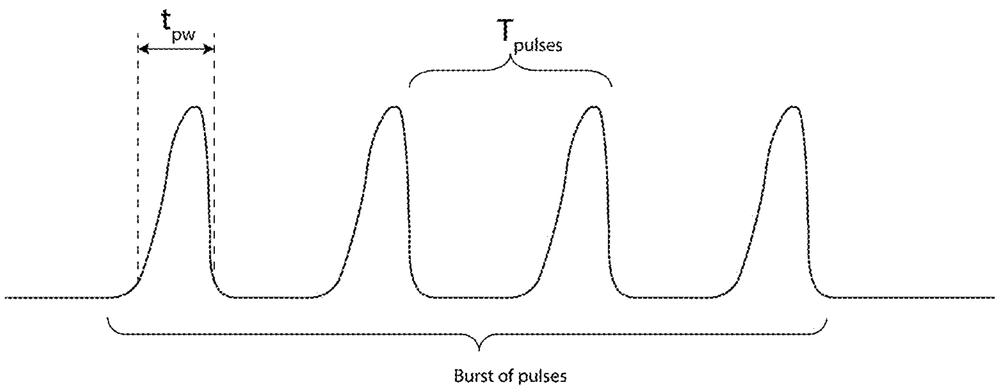
FIG. 1B shows a bust of pulses from a nanosecond pulser according to some embodiments.

FIG. 1A shows an example pulse from a nanosecond pulser. FIG. 1B shows a burst of pulses from a nanosecond pulser. A burst may include a plurality of pulses within a short time frame. The burst from the nanosecond pulser can have a pulse repetition frequency of about 10 kHz, 50 Hz, 100 kHz, 500 kHz, 1 MHz, etc.

Figure 2A:
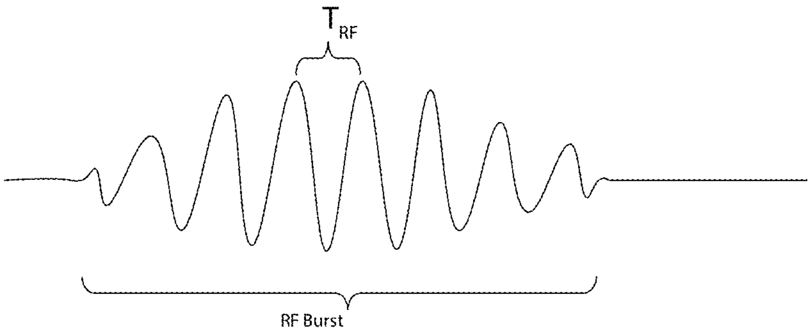
FIG. 2A shows a burst from an RF Driver according to some embodiments.
Figure 2B:
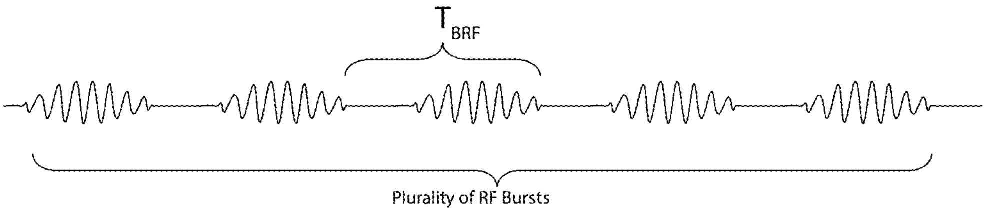
FIG. 2B shows a plurality of bursts from an RF Driver according to some embodiments.

FIG. 2A shows an example burst from a RF driver according to some embodiments. FIG. 2B shows an example, plurality of bursts from an RF driver according to some embodiments. Each burst can include a sinusoidal burst with an RF frequency of 200 kHz and 800 MHz such as, for example, 2 MHz, 13.56 MHz, 27 MHz, 60 MHz, and 80 MHz. In some embodiments, the burst repetition frequency (e.g., the frequency of bursts) may be about 10 kHz, 50 Hz, 100 kHz, 500 kHz, 1 MHz, etc. such as, for example, 400 kHz. In some embodiments, the RF driver may provide a continuous sinusoidal burst.

Figure 3:
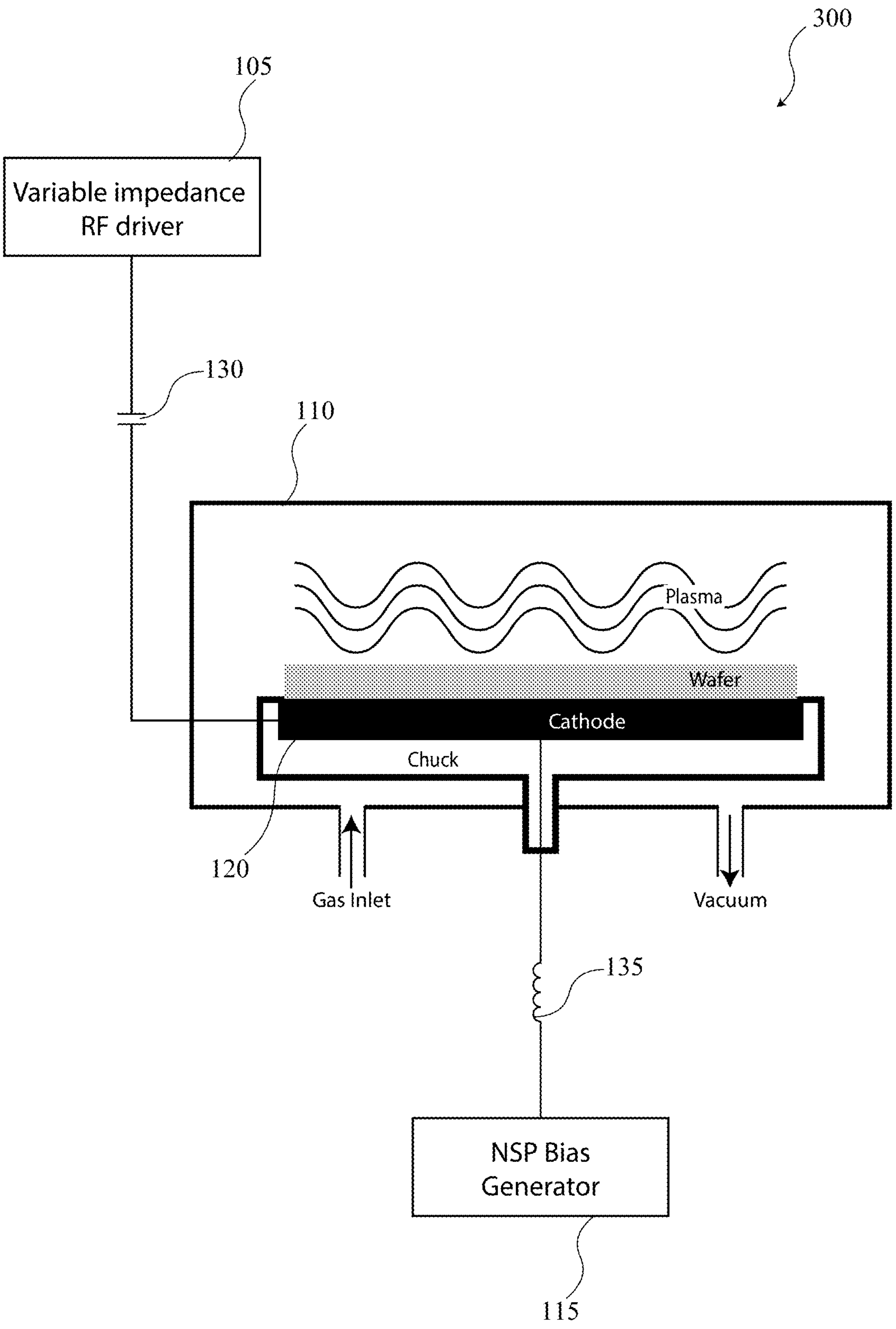
FIG. 3 is a schematic representation of a plasma system according to some embodiments.

FIG. 3 is a schematic representation of a plasma system 300. In some embodiments, the plasma system 300 may include a plasma chamber 110 with a RF driver 105 and a nanosecond pulser 115 according to some embodiments. The RF driver 105 can be coupled with the electrode 120 located within the plasma chamber 110. The nanosecond pulser 115 can be coupled with the electrode 120 located inside or outside the plasma chamber 110. In some embodiments, the electrode 120 may be part of or coupled with a electrostatic chuck.

In some embodiments, the plasma chamber 110 may include a vacuum pump that maintains vacuum conditions in the plasma chamber 110. The vacuum pump, for example, may be connected to the plasma chamber 110 with a specialized hose or stainless steel piping. The vacuum pump may be controlled manually or automatically by a machine by either a relay or pass-through plug on the machine. In some embodiments, the plasma chamber 110 may be represented by an idealized or effective circuit for semiconductor processing chamber such as, for example, a plasma deposition system, semiconductor fabrication system, plasma sputtering system, etc.

In some embodiments, the plasma chamber 110 may include an input gas source that may introduce gas (or a mixture of input gases) into the chamber before, after, or when the RF power is supplied. The ions in the gas create the plasma and the gas is evacuated through the vacuum pump.

In some embodiments, the plasma system may include a plasma deposition system, plasma etch system, or plasma sputtering system. In some embodiments, the capacitance between the electrode (or chuck) and wafer may have a capacitance less than about 1000 nF, 500 nF, 200 nF, 100 nF, 50 nF, 10 nF, 5000 pF, 1000 pF, 100 pF, etc.

The RF driver 105 may include any type of device that generates RF power that is applied to the electrode 120. The RF driver 105, for example, may include a nanosecond pulser, a resonant system driven by a half bridge or full bridge circuit, an RF amplifier, a non-linear transmission line, an RF plasma generator, etc. In some embodiments, the RF driver 105 may include a match network.

In some embodiments, the RF driver 105 may include one or more RF drivers that may generate an RF power signal having a plurality of different RF frequencies such as, for example, 2 MHz, 13.56 MHz, 27 MHz, 60 MHz, and 80 MHz. Typical RF frequencies, for example, may include frequencies between 200 kHz and 800 MHz In some embodiments, the RF driver 105 may create and sustain a plasma within the plasma chamber 110. The RF driver 105, for example, provides an RF signal to the electrode 120 (and/or the antenna 180, see below) to excite the various gases and/or ions within the chamber to create the plasma.

Figure 8:
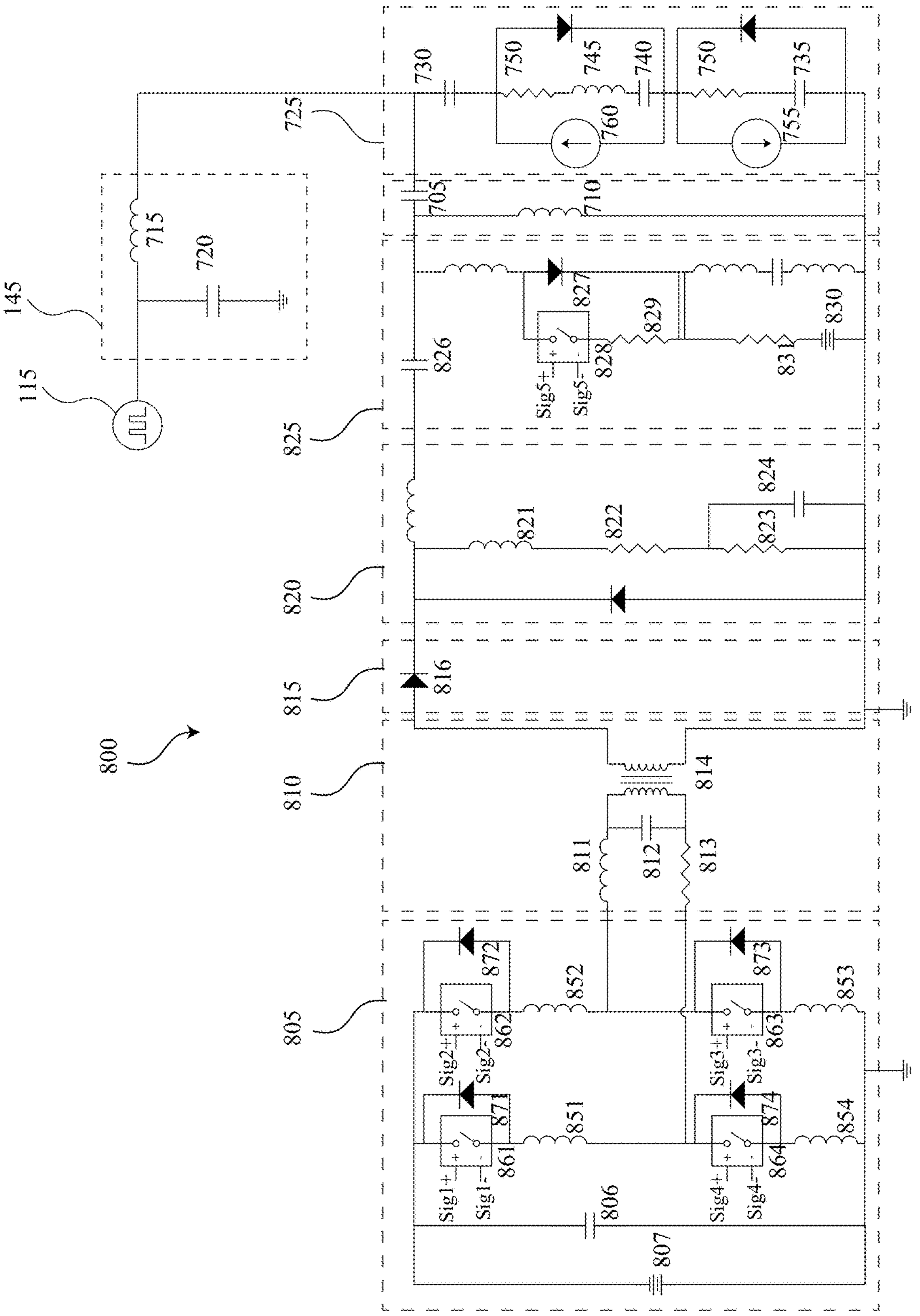
FIG. 8 is an example circuit diagram of a filtered RF driver and a nanosecond pulser according to some embodiments.
Figure 9:
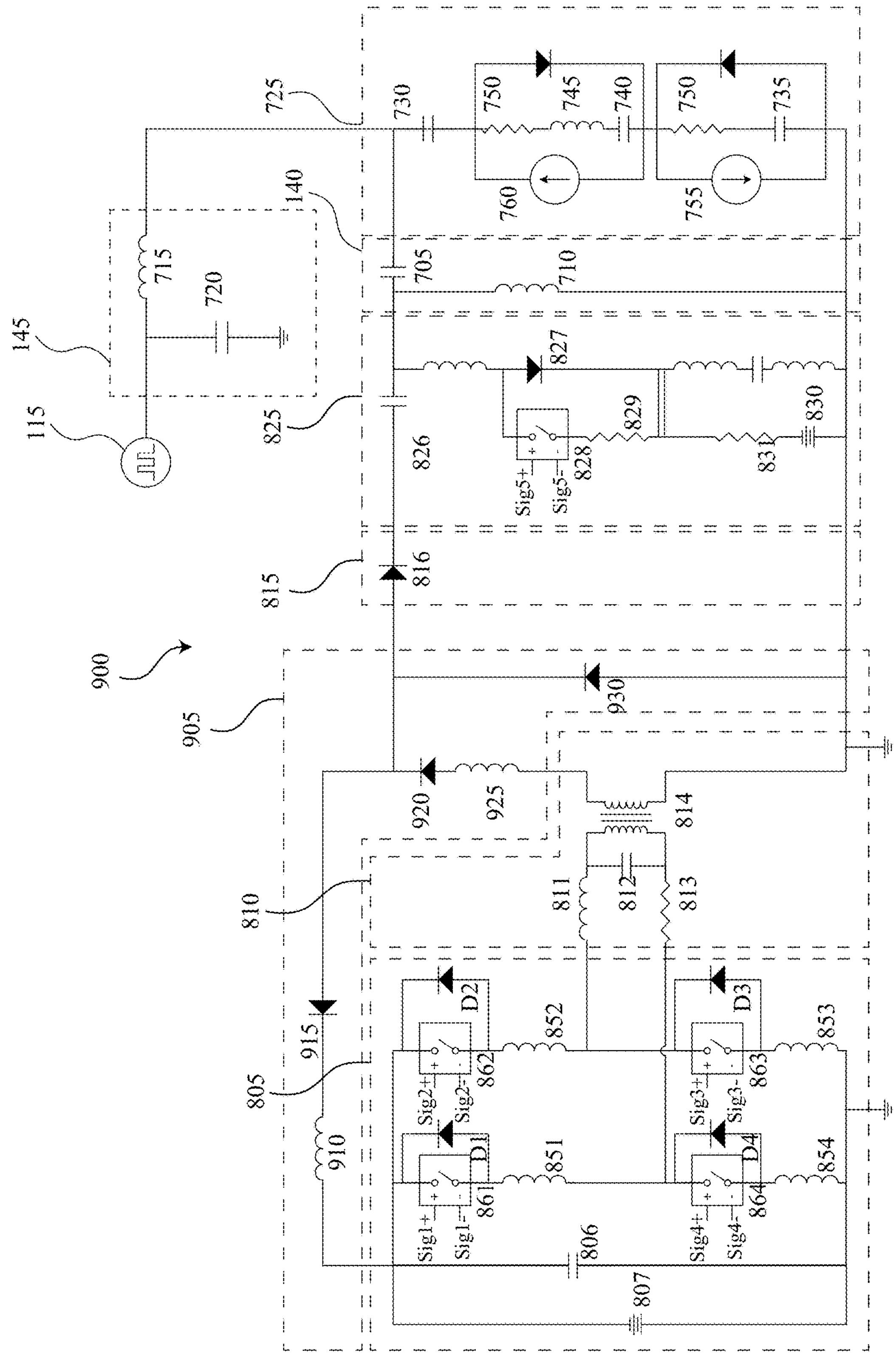
FIG. 9 is an example circuit diagram of a filtered RF driver and a nanosecond pulser according to some embodiments.

In some embodiments, the RF driver 105 may include any or all portions of the RF driver 800 shown in FIG. 8 and/or the RF driver 900 shown in FIG. 9.

In some embodiments, the RF driver 105 may be coupled with or may include an impedance matching circuit, which may match the output impedance of the RF driver 105 to the industry standard characteristic impedance of the coaxial cable of 50Ω or any cable.

The nanosecond pulser 115 may include one or more nanosecond pulsers. In some embodiments the nanosecond pulser 115 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes, or all or any portion of any device described in U.S. patent application Ser. No. 16/697,173, titled "VARIABLE OUTPUT IMPEDANCE RF GENERATOR," which is incorporated into this disclosure for all purposes.

The nanosecond pulser 115 may, for example, include the nanosecond pulser 1100 or the nanosecond pulser 1000.

In some embodiments, the nanosecond pulser 115 may pulse voltages with amplitudes of about 1 kV to about 40 kV. In some embodiments, the nanosecond pulser 115 may switch with a pulse repetition frequency up to about 2,000 kHz. In some embodiments, the nanosecond pulser may switch with a pulse repetition frequency of about 400 kHz. In some embodiments, the nanosecond pulser 115 may provide single pulses of varying pulse widths from about 2000 ns to about 1 nanosecond. In some embodiments, the nanosecond pulser 115 may switch with a pulse repetition frequency greater than about 10 kHz. In some embodiments, the nanosecond pulser 115 may operate with rise times less than about 400 ns on the load.

In some embodiments, the nanosecond pulser 115 can produce pulses from the power supply with voltages greater than 2 kV, with rise times less than about 400 ns on the load, and with a pulse repetition frequency greater than about 10 kHz.

In some embodiments, the nanosecond pulser 115 may include one or more solid state switches (e.g., solid state switches such as, for example, IGBTs, a MOSFETs, a SiC MOSFETs, SiC junction transistors, FETs, SiC switches, GaN switches, photoconductive switches, etc.), one or more snubber resistors, one or more snubber diodes, one or more snubber capacitors, and/or one or more freewheeling diodes. The one or more switches and or circuits can be arranged in parallel or series. In some embodiments, one or more nanosecond pulsers can be ganged together in series or parallel to form the nanosecond pulser 115. In some embodiments, a plurality of high voltage switches may be ganged together in series or parallel to form the nanosecond pulser 115.

In some embodiments, the nanosecond pulser 115 may include circuitry to remove charge from a capacitive load in fast time scales such as, for example, a resistive output stage, a sink, or an energy recovery circuit. In some embodiments, the charge removal circuitry may dissipate charge from the load, for example, on fast time scales (e.g., 1 ns, 10 ns, 50 ns, 100 ns, 250 ns, 500 ns, 1,000 ns, etc. time scales).

In some embodiments, a DC bias power supply stage may be included to bias the output voltage to the electrode 120 either positively or negatively. In some embodiments, a capacitor may be used to isolate/separate the DC bias voltage from the charge removal circuitry or other circuit elements. It may also allow for a potential shift from one portion of the circuit to another. In some applications the potential shift may be used to hold a wafer in place.

In some embodiments, the RF driver 105 may produce burst with an RF frequency greater than the pulse repetition frequency of the pulses produced by the nanosecond pulser 115.

In some embodiments, a capacitor 130 may be disposed (e.g., in series) between the RF driver 105 and the electrode 120. The capacitor 130 may be used, for example, to filter low frequency signals from the nanosecond pulser 115. These low frequency signals, for example, may have frequencies (e.g., the majority of spectral content) of about 100 kHz and 10 MHz such as, for example, about 10 MHz. The capacitor 130, for example, may have values of about 1 pF to 1 nF such as, for example, less than about 100 pF.

In some embodiments, an inductor 135 may disposed (e.g., in series) between the nanosecond pulser 115 and the electrode 120. The inductor 135 may be used, for example, to filter high frequency signals from the RF driver 105. These high frequency signals, for example, may have frequencies from about 1 MHz to 200 MHz such as, for example, greater than about 1 MHz or 10 MHz. The inductor 135, for example, may have values from about 10 nH to 10 μH such as, for example, greater than about 1 μH. In some embodiments, the inductor 135 may have a low coupling capacitance across it. In some embodiments, the coupling capacitance may be less than 1 nF In some embodiments, either or both the capacitor 130 and the inductor 135 may isolate the pulses produce by the RF driver 105 from the pulses produce by the nanosecond pulser 115. For example, the capacitor 130 may isolate the pulses produced by the nanosecond pulser 115 from the pulses produced by the RF driver 105. The inductor 135 may isolate the pulses produced by the RF driver 105 from the pulses produced by the nanosecond pulser 115.

Figure 4:
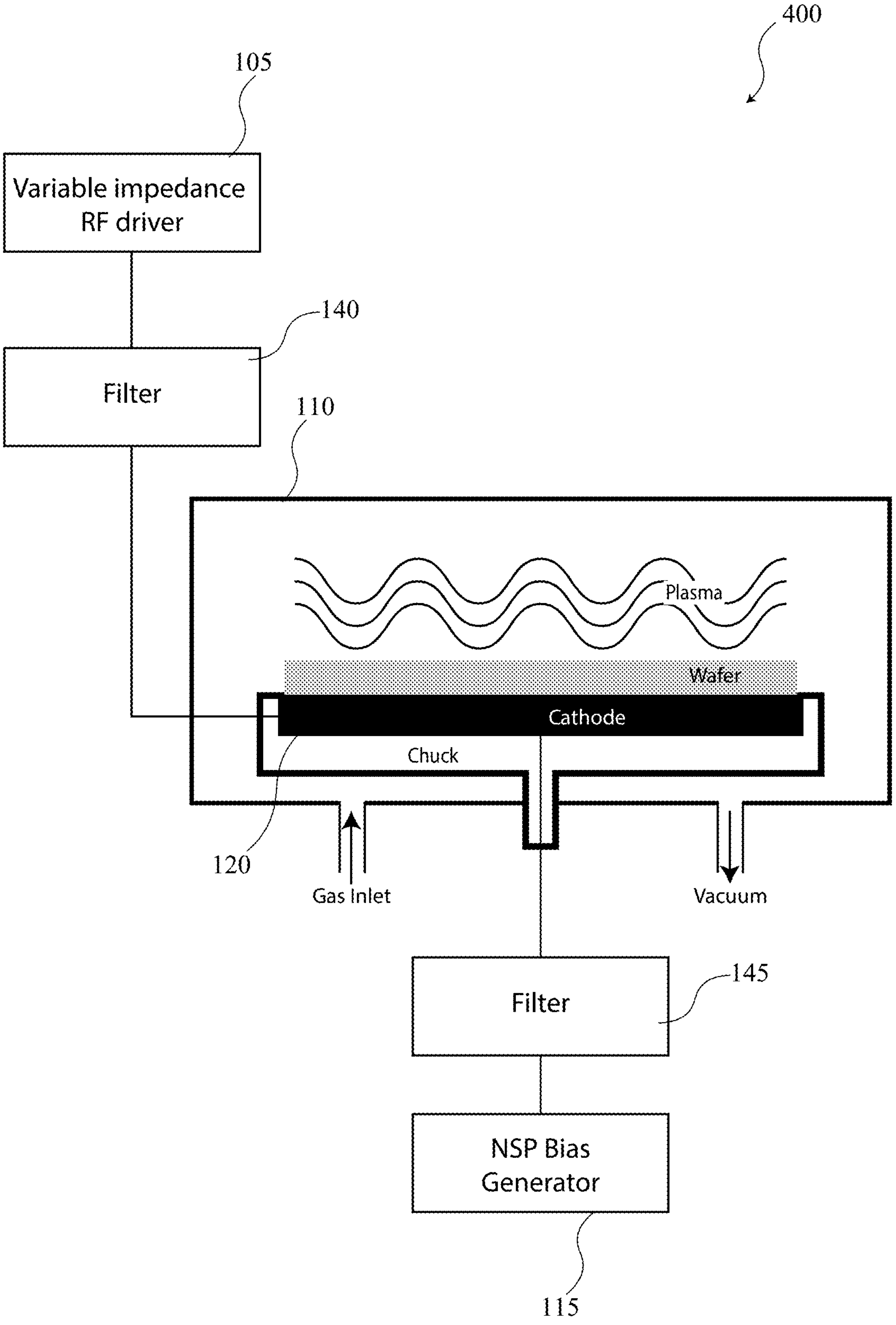
FIG. 4 is a schematic representation of a plasma system according to some embodiments.

FIG. 4 is a schematic representation of a plasma system 400. Plasma system 400 includes plasma chamber 110 with the RF driver 105 and a filtered nanosecond pulser 115 according to some embodiments. Portions of the plasma system 400 may be similar to the plasma system 300 in FIG. 3. In this embodiment, a filter 140 may replace the capacitor 130 and/or the filter 145 may replace the inductor 135. The filters alternately protect the RF driver from the pulses produced by the NSP bias generator, and the nanosecond pulser from the RF produced by the RF driver. Numerous different filters may be employed to accomplish this.

In some embodiments, the RF driver 105 may produce bursts with an RF frequency, $f_p$, greater than pulse repetition frequency in each burst produced by the nanosecond pulser 115.

In some embodiments, the filter 140 may be disposed (e.g., in series) between the RF driver 105 and the electrode 120. The filter 140 may be a high pass filter that allows high frequency pulses with frequencies from about 1 MHz to 200 MHz such as, for example, about 1 MHz or 10 MHz. The filter 140, for example, may include any type of filter that can pass these high frequency signals.

In some embodiments, the filter 145 may be disposed (e.g., in series) between the nanosecond pulser 115 and the electrode 120. The filter 145 may be a low pass filter that allows low frequency pulses with frequencies less than about 100 kHz and 10 MHz such as, for example, about 10 MHz. The filter 145, for example, may include any type of filter that can pass these low frequency signals.

In some embodiments, either or both the filter 140 and the filter 145 may isolate the pulses produce by the RF driver 105 from the pulses produce by the nanosecond pulser 115. For example, the filter 140 may isolate the pulses produced by the nanosecond pulser 115 from the pulses produced by the RF driver 105. The filter 145 may isolate the pulses produced by the RF driver 105 from the pulses produced by the nanosecond pulser 115.

Figure 5:
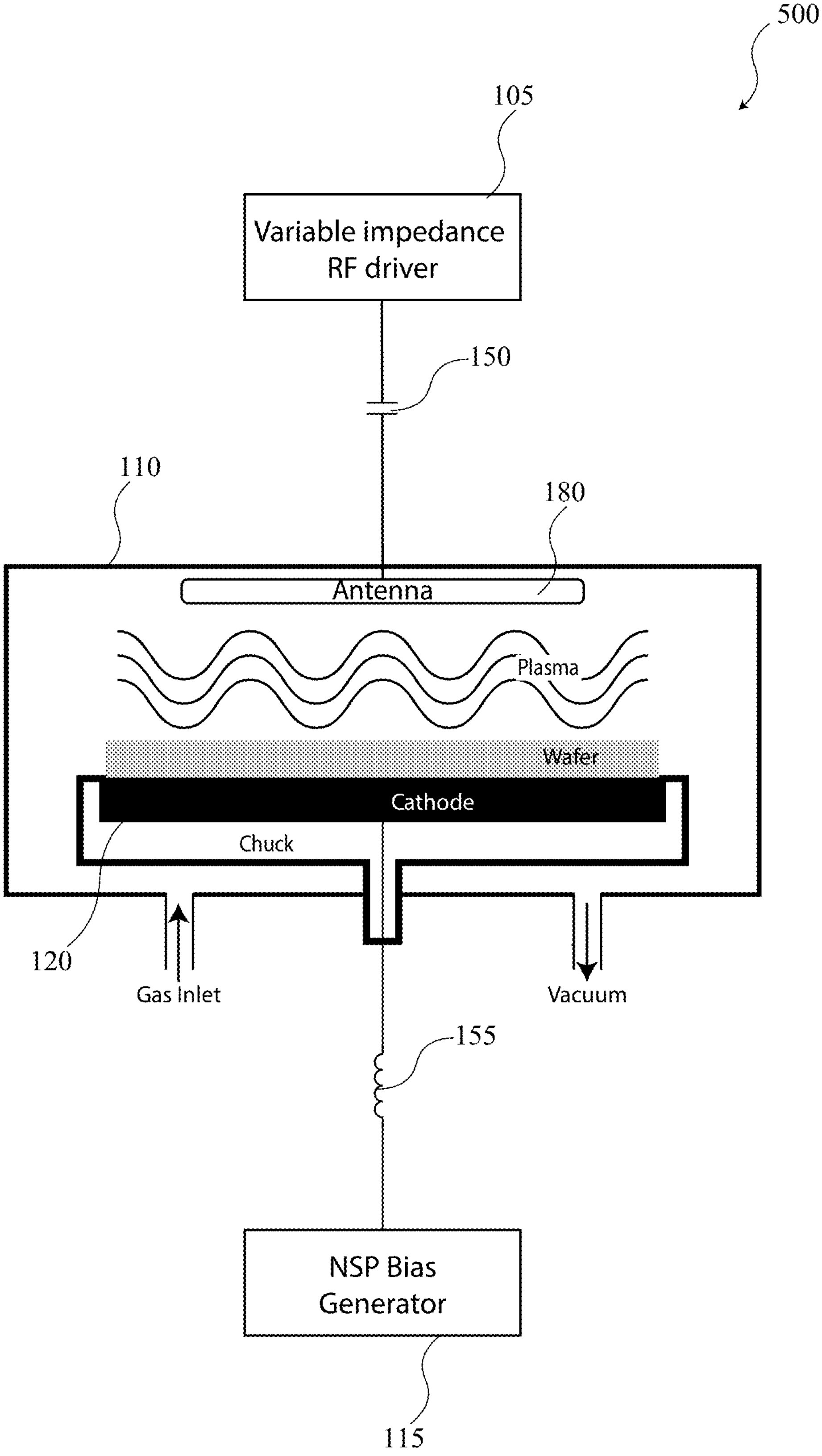
FIG. 5 is a schematic representation of a plasma system according to some embodiments.

FIG. 5 is a schematic representation of a plasma system 500. The plasma system 500 may include a plasma chamber 110 with an RF driver 105 and a nanosecond pulser 115 according to some embodiments.

The RF driver 105 may include any type of device that generates RF power that is applied to the antenna 180. In some embodiments, the RF driver 105 may include one or more RF drivers that may generate an RF power signal having a plurality of different RF frequencies such as, for example, 2 MHz, 13.56 MHz, 27 MHz, and 60 MHz.

In some embodiments, the RF driver 105 may be coupled with or may include an impedance matching circuit, which may match the output impedance of the RF driver 105, which is typically 50Ω, to the variable impedance of the plasma load, which is typically much smaller and may be reactive.

In some embodiments, the RF driver 105 may include one or more nanosecond pulsers.

In some embodiments, the nanosecond pulser 115 is described in conjunction with FIG. 1. In some embodiments, the nanosecond pulser 1000 described in FIG. 10 or the nanosecond pulser 1100 described in FIG. 11.

In some embodiments, the RF driver 105 may produce pulses with an RF frequency greater than the pulse repetition frequency of the pulses produced by the nanosecond pulser 115.

In some embodiments, a capacitor 150 may be disposed (e.g., in series) between the RF driver 105 and the antenna 180. The capacitor 150 may be used, for example, to filter low frequency signals from the nanosecond pulser 115. These low frequency signals, for example, may have frequencies less than about 100 kHz and 10 MHz such as, for example, about 10 MHz. The capacitor 150, for example, may have values of about 1 pF to 1 nF such as, for example, less than about 100 pF.

In some embodiments, an inductor 155 may disposed (e.g., in series) between the nanosecond pulser 115 and the electrode 120. The inductor 135 may be used, for example, to filter high frequency signals from the RF driver 105. These high frequency signals, for example, may have frequencies greater than about 1 MHz to 200 MHz such as, for example, greater than about 1 MHz or 10 MHz. The inductor 155, for example, may have values less than about 10 nH to 10 μH such as, for example, greater than about 1 μH. In some embodiments, the inductor 155 may have a low coupling capacitance across it.

In some embodiments, either or both the capacitor 150 and the inductor 155 may isolate the pulses produce by the RF driver 105 from the pulses produce by the nanosecond pulser 115. For example, the capacitor 150 may isolate the pulses produced by the nanosecond pulser 115 from the pulses produced by the RF driver 105. The inductor 155 may isolate the pulses produced by the RF driver 105 from the pulses produced by the nanosecond pulser 115.

Figure 6:
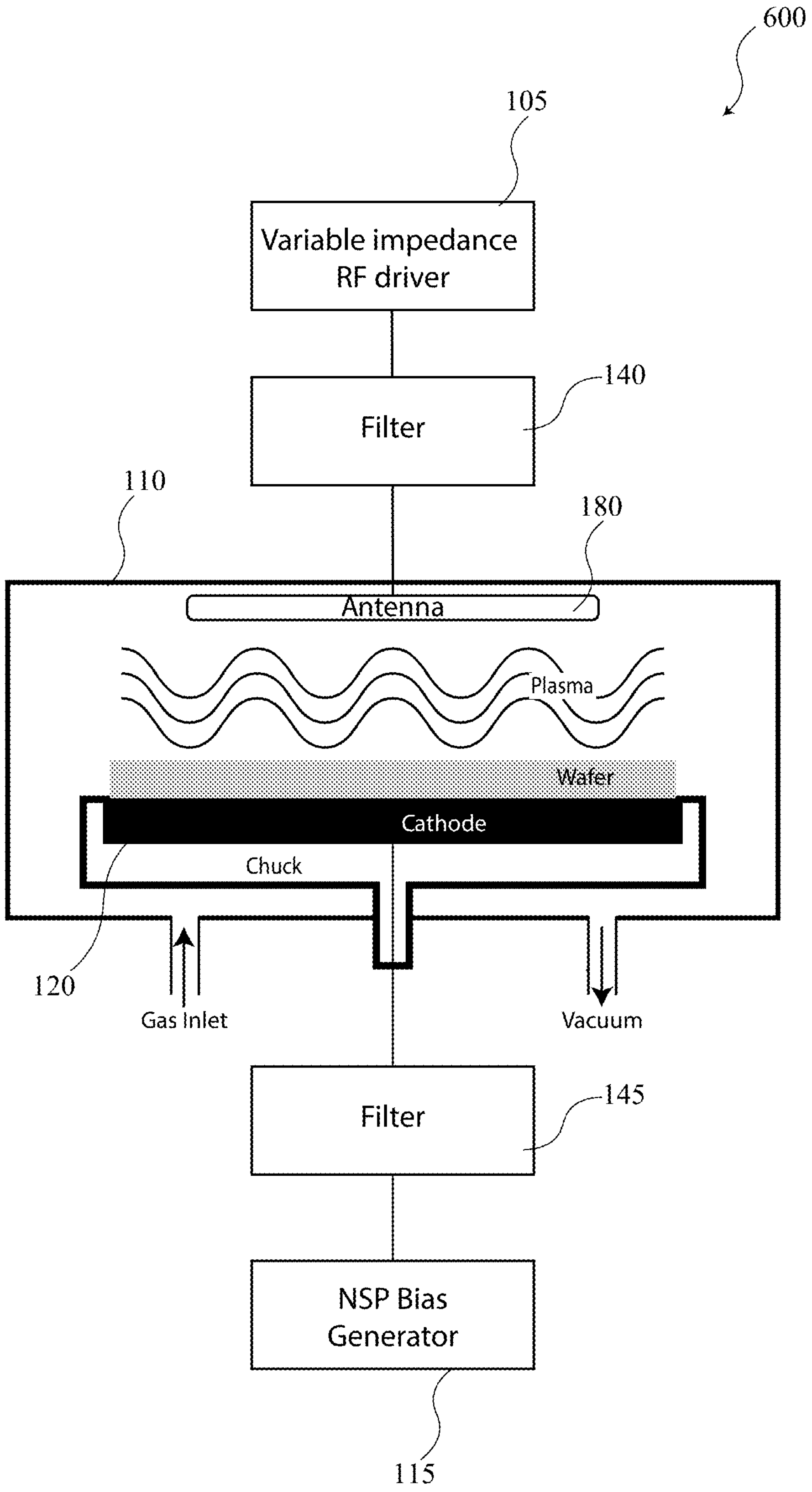
FIG. 6 is a schematic representation of a plasma system according to some embodiments.

FIG. 6 is a schematic representation of a plasma system 600 with an RF driver 105 and a nanosecond pulser 115 according to some embodiments. The RF driver 105 may include any type of RF driver. Portions of the plasma system 600 may be similar to the plasma system 500 in FIG. 5. A filter 140 may replace the capacitor 150 and/or the filter 145 may replace the inductor 135 used in FIG. 5.

The plasma system 600 includes a plasma chamber 725. The RF driver 105 and/or the nanosecond pulser 115 produce bursts and/or pulses that drive a plasm within the plasma chamber 725. The plasma chamber 725 is an idealized and/or effective circuit representation of a plasma and a plasma chamber.

In some embodiments, the RF driver 105 may produce bursts with an RF frequency greater than the pulse repetition frequency of the pulses produced by the nanosecond pulser 115.

In some embodiments, the filter 140 may be disposed (e.g., in series) between the RF driver 105 and the electrode 120. The filter 140 may be a high pass filter that allows high frequency pulses with frequencies greater than about 1 MHz to 200 MHz such as, for example, greater than about 1 MHz or 10 MHz. The filter 140, for example, may include any type of filter that can pass these high frequency signals.

In some embodiments, the filter 145 may be disposed (e.g., in series) between the nanosecond pulser 115 and the electrode 120. The filter 145 may be a low pass filter that allows low frequency pulses with frequencies less than about 100 kHz and 10 MHz such as, for example, about 10 MHz. The filter 145, for example, may include any type of filter that can pass these low frequency signals.

In some embodiments, either or both the filter 140 and the filter 145 may isolate the pulses produce by the RF driver 105 from the pulses produce by the nanosecond pulser 115 and/or vice versa. For example, the filter 140 may isolate the pulses produced by the nanosecond pulser 115 from the pulses produced by the RF driver 105. The filter 145 may isolate the pulses produced by the RF driver 105 from the pulses produced by the nanosecond pulser 115.

Figure 7:
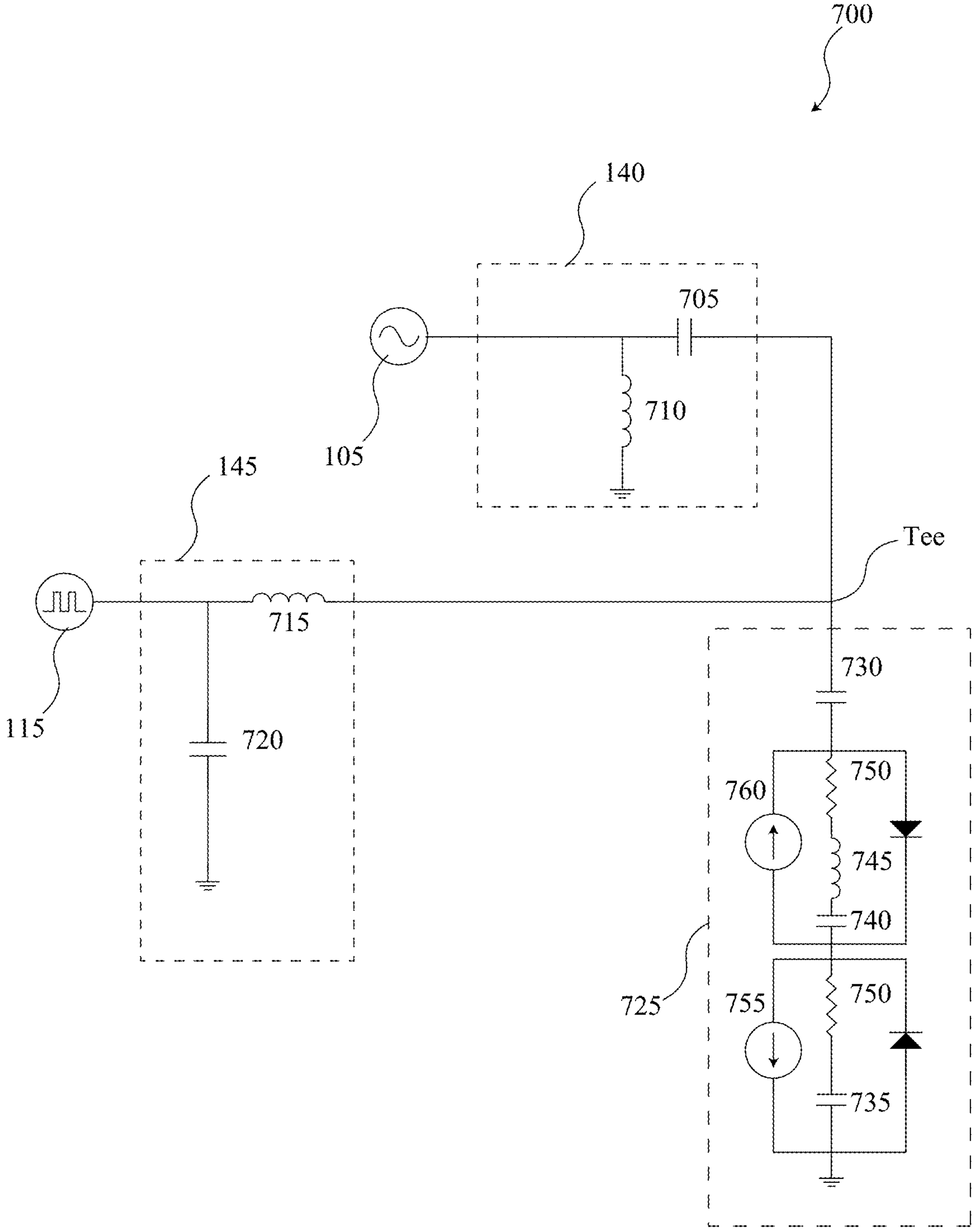
FIG. 7 is an example circuit diagram of a filtered RF driver and a nanosecond pulser according to some embodiments.

FIG. 7 is an example circuit diagram 700 of a RF driver 105 and a nanosecond pulser 115 driving a plasma within the plasma chamber 725 according to some embodiments. In some embodiments, the RF driver 105 may operate at a frequency of about 60 MHz.

In some embodiments, the impedance filter 140 may also serve as a high pass filter that protects the RF driver 105 from the output of the nanosecond pulser 720. For example, capacitor 720 may filter the output of the nanosecond pulser 720. The RF driver 105, for example, may operate at frequencies greater than 1 MHz, 10 MHz, 100 MHz, 1,000 MHz, etc. The impedance matching network, for example, may include any type of impedance matching networks that can serve as a high pass filter. In some embodiments, the impedance matching network may also serve as a high pass filter (e.g., filter 140) such as, for example, when it includes a series capacitance that is less than 10 nF, 1 nF, 100 pF, 10 pF, 1 pF.

The plasma chamber 110 may be represented by a number of equivalent circuit elements shown within an effective (or idealized) plasma chamber 725.

In some embodiments, the plasma chamber 725 may be represented by an idealized or effective circuit for semiconductor processing chamber such as, for example, a plasma deposition system, semiconductor fabrication system, plasma sputtering system, etc. The capacitor 730, for example, may represent the capacitance of a chuck upon which a wafer may sit. The chuck, for example, may comprise a dielectric material. For example, the capacitor 730 may have small capacitance (e.g., about 10 pF, 100 pF, 500 pF, 1 nF, 10 nF, 100 nF, etc.).

A plasma sheath may form within the plasma chamber that may include a non-neutral region to balance electron and ion losses. The wafer-sheath capacitor 740 represents the capacitance of the plasma sheath, which may be formed between the plasma and the top surface of the wafer. The resistor 750, for example, may represent the sheath resistance of the plasma and the wafer. The inductor 745, for example, may represent the sheath inductance between the plasma and the wafer. The current source 760, for example, may be represent the ion current through the sheath. For example, the wafer-sheath capacitor 740 may have small capacitance (e.g., about 10 pF, 100 pF, 500 pF, 1 nF, 10 nF, 100 nF, etc.).

The wall-sheath capacitor 735 represents the capacitance of the wall sheath, which may form between the plasma and one or more of the walls of the plasma chamber. The resistor 750, for example, may represent the resistance between the plasma of a processing chamber wall and the plasma. The current source 755, for example, may be representative of the ion current in the plasma. For example, the wall-sheath capacitance C1 (e.g., capacitance of wall-sheath capacitor 735) may have small capacitance (e.g., about 10 pF, 100 pF, 500 pF, 1 nF, 10 nF, 100 nF, etc.).

Various other plasma sheaths may be formed between the portions of the chamber or electrodes and the plasma.

A sheath capacitance can be estimated from the Child-Langmuir sheath. The Child-Langmuir sheath can be calculated from:

$$\frac{S}{\lambda_D} = \frac{0.32}{\sqrt{\alpha_e}}\left(\frac{eV_0}{T_e}\right)^{3/4}$$

where $\lambda_D$ is the Debye length, s is the sheath length, $T_e$ is the electron temperature, $-V_0$ is the bias voltage on the boundary, and $\alpha_e$ is the electron density reduction factor at the sheath edge. The sheath capacitance can then be calculated from:

$$C = \frac{\varepsilon_0 A}{S},$$

where A is the area of the sheath boundary, and $\varepsilon_0$ is the permittivity of free space.

In some embodiments, the wall-sheath capacitance C1 (e.g., the capacitance of capacitor 735) may be larger than the wafer-sheath capacitance C3 (e.g., the capacitance of capacitor 740) ((C1>C3). For example, the ratio of the wall-sheath capacitance C1 divided by the wafer-sheath capacitance C3 may be greater than ten $$\left(\frac{C1}{C3} > 10\right).$$

As another example, the wall-sheath capacitance C1 shall be ten times the wafer-sheath capacitance C3 (C1>10*C3).

As another example, the ratio of the wall-sheath capacitance C1 divided by the sheath capacitance C3 may be greater than fifty $$\left(\frac{C1}{C3} > 50\right).$$

As another example, the wall-sheath capacitance C1 shall be fifty times the sheath capacitance C3 (C1>50*C3).

The RF driver 105 may include any type of device that generates RF power that is applied to the electrode in the plasma chamber 725. The RF driver 105, for example, may include a nanosecond pulser, a resonant system driven by a half bridge or full bridge circuit, an RF amplifier, a non-linear transmission line, an RF plasma generator, etc.

In some embodiments, the RF driver 105 may include one or more RF drivers that may generate an RF power signal having a plurality of different RF frequencies such as, for example, 2 MHz, 13.56 MHz, 27 MHz, 60 MHz, 80 MHz, etc. Typical RF frequencies, for example, may include frequencies between 200 kHz and 800 MHz In some embodiments, the RF driver 105 may create and sustain a plasma within the plasma chamber 725. The RF driver 105, for example, may provide an RF signal to the electrode (and/or the antenna, see below) to excite the various gases and/or ions within the chamber to create the plasma.

In some embodiments, the RF driver 105 may be coupled with or may include a matching network, which may match the output impedance of the RF driver 105, which is typically 50Ω, to the variable impedance of the plasma load, which is typically much smaller and may be reactive.

The nanosecond pulser 720 may include one or more nanosecond pulsers. In some embodiments the nanosecond pulser 720 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

In some embodiments, the nanosecond pulser 720 may pulse voltages with amplitudes of about 1 kV to about 40 kV. In some embodiments, the nanosecond pulser 720 may switch with a pulse repetition frequency up to about 2,000 kHz. In some embodiments, the nanosecond pulser may switch with a pulse repetition frequency of about 400 kHz. In some embodiments, the nanosecond pulser 720 may provide single pulses of varying pulse widths from about 2000 ns to about 1 nanosecond. In some embodiments, the nanosecond pulser 720 may switch with a pulse repetition frequency greater than about 10 kHz. In some embodiments, the nanosecond pulser 720 may operate with rise times less than about 400 ns on the load.

In some embodiments, the nanosecond pulser 720 can produce pulses from the power supply with voltages greater than 2 kV, with rise times less than about 80 ns, and with a pulse repetition frequency greater than about 10 kHz.

In some embodiments, the nanosecond pulser 720 may include one or more solid state switches (e.g., solid state switches such as, for example, IGBTs, a MOSFETs, a SiC MOSFETs, SiC junction transistors, FETs, SiC switches, GaN switches, photoconductive switches, etc.), one or more snubber resistors, one or more snubber diodes, one or more snubber capacitors, and/or one or more freewheeling diodes. The one or more switches and or circuits can be arranged in parallel or series. In some embodiments, one or more nanosecond pulsers can be ganged together in series or parallel to form the nanosecond pulser 720. In some embodiments, a plurality of high voltage switches may be ganged together in series or parallel to form the nanosecond pulser 720.

In some embodiments, the nanosecond pulser 720 may include circuitry to remove charge from a capacitive load in fast time scales such as, for example, a resistive output stage, a sink, or an energy recovery circuit. In some embodiments, the charge removal circuitry may dissipate charge from the load, for example, on fast time scales (e.g., 1 ns, 10 ns, 50 ns, 100 ns, 250 ns, 500 ns, 1,000 ns, etc. time scales).

FIG. 8 is a circuit diagram of an example RF driver 800 driving a plasma within the plasma chamber 725 according to some embodiments. In this example, the RF driver 800 is one example of an RF driver 105. The RF driver 800 may be coupled with the nanosecond pulser 115 and the filter 145.

In this example, the RF driver 800 may include an RF source 805, a resonant circuit 810, a half-wave rectifier 815, a resistive output stage 820, and/or a bias compensation circuit 825. The RF source 805 may be a full-bridge driver (or half-bridge driver). The RF source 805 may include an input voltage source 807 that may be a DC voltage source (e.g., a capacitive source, AC-DC converter, etc.). In some embodiments, the RF source 805 may include four switches 861, 862, 863, 864. In some embodiments, the RF source 805 may include a plurality of switches 861, 862, 863, and 864 in series or in parallel. These switches 861, 862, 863, 864, for example, may include any type of solid-state switch such as, for example, IGBTs, a MOSFETs, a SiC MOSFETs, SiC junction transistors, FETs, SiC switches, GaN switches, photoconductive switches, etc. These switches 861, 862, 863, and 864 may be switched at high frequencies and/or may produce a high voltage pulses. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

Each switch of switches 861, 862, 863, 864 may be coupled in parallel with a respective diode 871, 872, 873, and/or 874 and may include stray inductance represented by inductor 851, 852, 853, and 854. In some embodiments, the inductances of inductor 851, 852, 853, and 854 may be equal. In some embodiments, the inductances of inductor 851, 852, 853, and 854 may be less than about 50 nH, 100 nH, 150 nH, 500 nH, 1,000 nH, etc. The combination of a switch (861, 862, 863, or 864) and a respective diode (871, 872, 873, and/or 874) may be coupled in series with a respective inductor (851, 852, 853, or 854). Inductors 853 and 854 are connected with ground. Inductor 851 is connected with switch 864 and the resonant circuit 810. And inductor 852 is connected with switch 863 and the opposite side of the resonant circuit 810.

In some embodiments, the RF source 805 may be coupled with a resonant circuit 810. The resonant circuit 810 may include a resonant inductor 811 and/or a resonant capacitor 812 coupled with a transformer 814. The resonant circuit 810 may include a resonant resistor 813, for example, that may include the stray resistance of any leads between the RF source 805 and the resonant circuit 810 and/or any component within the resonant circuit 810 such as, for example, the resonant capacitor 812, the resonant resistor 813, and/or the resonant inductor 811. In some embodiments, the resonant resistor 813 may comprise only stray resistances of wires, traces, or circuit elements. While the inductance and/or capacitance of other circuit elements may affect the driving frequency, the driving frequency can be set largely by choice of the resonant inductor 811 and/or the resonant capacitor 812. Further refinements and/or tuning may be required to create the proper driving frequency in light of stray inductance or stray capacitance. In addition, the rise time across the transformer 814 can be adjusted by changing resonant inductor 811 (L) and/or resonant capacitor 812 (C), provided that:

$$f_{resonant} = \frac{1}{2\pi\sqrt{(L)(C)}} = \text{constant.}$$

In some embodiments, large inductance values for resonant inductor 811 can result in slower or shorter rise times. These values may also affect the burst envelope. Each burst can include transient and steady state pulses. The transient pulses within each burst may be set by resonant inductor 811 and/or the Q of the system until full voltage is reached during the steady state pulses.

If the switches in the RF source 805 are switched at the resonant frequency, $f_{resonant}$, then the output voltage at the transformer 814 will be amplified. In some embodiments, the resonant frequency may be about 400 kHz, 0.5 MHz, 2.0 MHz, 4.0 MHz, 13.56 MHz, 27.12 MHz, 40.68 MHz, 50 MHz, etc.

In some embodiments, the resonant capacitor may include the stray capacitance of the transformer 814 and/or a physical capacitor. In some embodiments, the resonant capacitor may have a capacitance of about 10 μF, 1 μF, 100 nF, 10 nF, etc. In some embodiments, the resonant inductor 811 may include the stray inductance of the transformer 814 and/or a physical inductor. In some embodiments, the resonant inductor 811 may have an inductance of about 50 nH, 100 nH, 150 nH, 500 nH, 1,000 nH, etc. In some embodiments, the resonant resistor 813 may have a resistance of about 10Ω, 25Ω, 50Ω, 100Ω, 150Ω, 500Ω, etc.

In some embodiments, the transformer 814 may be optional. In some embodiments, one or more of resistor 813, resonant inductor 811, and/or resonant capacitor 812 may be disposed on the secondary side of the transformer 814.

In some embodiments, the resonant resistor 813 may represent the stray resistance of wires, traces, and/or the transformer windings within the physical circuit. In some embodiments, the resonant resistor 813 may have a resistance of about 10 mΩ, 50 mΩ, 100 mΩ, 200 mΩ, 500 mΩ, etc.

In some embodiments, the transformer 814 may comprise a transformer as disclosed in U.S. patent application Ser. No. 15/365,094, titled "High Voltage Transformer," which is incorporated into this document for all purposes. In some embodiments, the output voltage of the resonant circuit 810 can be changed by changing the duty cycle (e.g., the switch "on" time or the time a switch is conducting) of switches 861, 862, 863, and/or 864. For example, the longer the duty cycle, the higher the output voltage; and the shorter the duty cycle, the lower the output voltage. In some embodiments, the output voltage of the resonant circuit 810 can be changed or tuned by adjusting the duty cycle of the switching in the RF source 805.

For example, the duty cycle of the switches can be adjusted by changing the duty cycle of signal Sig1, which opens and closes switch 861; changing the duty cycle of signal Sig2, which opens and closes switch 862; changing the duty cycle of signal Sig3, which opens and closes switch 863; and changing the duty cycle of signal Sig4, which opens and closes switch 864. By adjusting the duty cycle of the switches 861, 862, 863, or 864, for example, the output voltage of the resonant circuit 810 or the voltage on the load can be controlled in real time.

In some embodiments, each switch 861, 862, 863, or 864 in the RF source 805 can be switched independently or in conjunction with one or more of the other switches. For example, the signal Sig1 may be the same signal as signal Sig3. As another example, the signal Sig2 may be the same signal as signal Sig4. As another example, each signal may be independent and may control each switch 861, 862, 863, or 864 independently or separately.

In some embodiments, the resonant circuit 810 may be coupled with a half-wave rectifier 815 that may include a rectifying diode 816.

In some embodiments, the half-wave rectifier 815 may be coupled with the resistive output stage 820. The resistive output stage 820 may include any resistive output stage known in the art. For example, the resistive output stage 820 may include any resistive output stage described in U.S. patent application Ser. No. 16/178,538 titled "HIGH VOLTAGE RESISTIVE OUTPUT STAGE CIRCUIT," which is incorporated into this disclosure in its entirety for all purposes.

For example, the resistive output stage 820 may include an inductor 821, resistor 822, resistor 823, and capacitor 824. In some embodiments, inductor 821 may include an inductance of about 5 μH to about 25 μH. In some embodiments, the resistor 823 may include a resistance of about 50Ω to about 250Ω. In some embodiments, the resistor 822 may comprise the stray resistance in the resistive output stage 820.

In some embodiments, the resistor 823 may include a plurality of resistors arranged in series and/or parallel. The capacitor 824 may represent the stray capacitance of the resistor 823 including the capacitance of the arrangement series and/or parallel resistors. The capacitance of stray capacitor 824, for example, may be less than 500 pF, 250 pF, 100 pF, 50 pF, 10 pF, 1 pF, etc. The capacitance of stray capacitor 824, for example, may be less than the load capacitance such as, for example, less than the capacitance of capacitor 735, capacitor 730, and/or capacitor 740.

In some embodiments, the resistor 823 may discharge the load (e.g., a plasma sheath capacitance). In some embodiments, the resistive output stage 820 may be configured to discharge over about 1 kilowatt of average power during each pulse cycle and/or a joule or less of energy in each pulse cycle. In some embodiments, the resistance of the resistor 823 in the resistive output stage 820 may be less than 200Ω. In some embodiments, the resistor 823 may comprise a plurality of resistors arranged in series or parallel having a combined capacitance less than about 200 pF (e.g., capacitor 824).

In some embodiments, the resistive output stage 820 may include a collection of circuit elements that can be used to control the shape of a voltage waveform on a load. In some embodiments, the resistive output stage 820 may include passive elements only (e.g., resistors, capacitors, inductors, etc.). In some embodiments, the resistive output stage 820 may include active circuit elements (e.g., switches) as well as passive circuit elements. In some embodiments, the resistive output stage 820, for example, can be used to control the voltage rise time of a waveform and/or the voltage fall time of waveform.

In some embodiments, the resistive output stage 820 can discharge capacitive loads (e.g., a wafer and/or a plasma). For example, these capacitive loads may have small capacitance (e.g., about 10 pF, 100 pF, 500 pF, 1 nF, 10 nF, 100 nF, etc.).

In some embodiments, a resistive output stage can be used in circuits with pulses having a high pulse voltage (e.g., voltages greater than 1 kV, 10 kV, 20 kV, 50 kV, 100 kV, etc.) and/or high frequencies (e.g., frequencies greater than 1 kHz, 10 kHz, 100 kHz, 200 kHz, 500 kHz, 1 MHz, etc.) and/or frequencies of about 400 kHz, 0.5 MHz, 2.0 MHz, 4.0 MHz, 13.56 MHz, 27.12 MHz, 40.68 MHz, 50 MHz, etc.

In some embodiments, the resistive output stage may be selected to handle high average power, high peak power, fast rise times and/or fast fall times. For example, the average power rating might be greater than about 0.5 kW, 1.0 kW, 10 kW, 25 kW, etc., and/or the peak power rating might be greater than about 1 kW, 10 kW, 100 kW, 1 MW, etc.

In some embodiments, the resistive output stage 820 may include a series or parallel network of passive components. For example, the resistive output stage 820 may include a series of a resistor, a capacitor, and an inductor. As another example, the resistive output stage 820 may include a capacitor in parallel with an inductor and the capacitor-inductor combination in series with a resistor. For example, inductor 821 can be chosen large enough so that there is no significant energy injected into the resistive output stage when there is voltage out of the rectifier. The values of resistor 822 and resistor 823 can be chosen so that the L/R time can drain the appropriate capacitors in the load faster than the RF frequency In some embodiments, the resistive output stage 820 may be coupled with the bias compensation circuit 825. The bias compensation circuit 825 may include any bias and/or bias compensation circuit known in the art. For example, the bias compensation circuit 825 may include any bias and/or bias compensation circuit described in U.S. patent application Ser. No. 16/523,840 titled "NANOSECOND PULSER BIAS COMPENSATION," which is incorporated into this disclosure in its entirety for all purposes. In some embodiments, the resistive output stage 820 and/or the bias compensation circuit 825 may be optional.

In some embodiments, a nanosecond pulser may include a resistive output stage that is similar to the resistive output stage 820.

In some embodiments, the bias compensation circuit 825 may include a bias capacitor 826, blocking capacitor 826, a blocking diode 827, switch 828 (e.g., a high voltage switch), offset supply voltage 830, resistance 831, and/or resistance 829. In some embodiments, the switch 828 comprises a high voltage switch described in U.S. Patent Application No. 82/717,637, titled "HIGH VOLTAGE SWITCH FOR NANOSECOND PULSING," and/or in U.S. patent application Ser. No. 16/178,565, titled "HIGH VOLTAGE SWITCH FOR NANOSECOND PULSING," which is incorporated into this disclosure in its entirety for all purposes.

In some embodiments, the offset supply voltage 830 may include a DC voltage source that can bias the output voltage either positively or negatively. In some embodiments, the blocking capacitor 826 may isolate/separate the offset supply voltage 830 from the resistive output stage 820 and/or other circuit elements. In some embodiments, the bias compensation circuit 825 may allow for a potential shift of power from one portion of the circuit to another. In some embodiments, the bias compensation circuit 825 may be used to hold a wafer in place as high voltage pulses are active within the chamber. Resistance 831 may protect/isolate the DC bias supply from the driver.

In some embodiments, the switch 828 may be open while the RF source 805 is pulsing and closed when the RF source 805 is not pulsing. While closed, the switch 828 may, for example, short current across the blocking diode 827. Shorting this current may allow the bias between the wafer and the chuck to be less than 2 kV, which may be within acceptable tolerances.

FIG. 9 is a circuit diagram of an RF driver circuit 900 driving a plasma within the plasma chamber 725 according to some embodiments. In this example, the RF driver 900 is one example of an RF driver 105. The RF driver circuit 900 may be coupled with the nanosecond pulser 115 and the filter 145.

In this example, the RF driver circuit 900 may include an RF source 805, a resonant circuit 810, a half-wave rectifier 815, an energy recovery circuit 905, and/or a bias compensation circuit 825. The RF source 805 may be a full-bridge driver (or half-bridge driver).

The RF driver 900 is similar to the RF driver 800 with the resistive output stage 820 is replaced with an energy recovery circuit 905. The resistive output stage 820 and the energy recovery circuit 905 can be referred to as an energy sink circuit. In some embodiments, the energy recovery circuit 905 and/or the bias compensation circuit 825 may be optional.

In this example, the energy recovery circuit 905 may be positioned on or electrically coupled with the secondary side of the transformer 814. The energy recovery circuit 905, for example, may include a diode 930 (e.g., a crowbar diode) across the secondary side of the transformer 814. The energy recovery circuit 905, for example, may include diode 915 and inductor 910 (arranged in series), which can allow current to flow from the secondary side of the transformer 814 to charge the power supply 806 and current to flow to the plasma chamber 725. The diode 915 and the inductor 910 may be electrically connected with the secondary side of the transformer 814 and coupled with the power supply 806. The diode 915 and the inductor 910 may be In some embodiments, the energy recovery circuit 905 may include diode 920 and/or inductor 925 electrically coupled with the secondary of the transformer 814. The inductor 910 may represent the stray inductance and/or may include the stray inductance of the transformer 814.

When the pulser stage 1010 is turned on (pulsing), current may charge the plasma chamber 725 (e.g., charge the capacitor 735, capacitor 730, or capacitor 740). Some current, for example, may flow through inductor 910 when the voltage on the secondary side of the transformer 814 rises above the charge voltage on the power supply 806. When the nanosecond pulser is turned off, current may flow from the capacitors within the plasma chamber 725 through the inductor 910 to charge the power supply 806 until the voltage across the inductor 910 is zero. The diode 930 may prevent the capacitors within the plasma chamber 725 from ringing with the inductance in the plasma chamber 725 or the bias compensation circuit 825.

The diode 915 may, for example, prevent charge from flowing from the power supply 806 to the capacitors within the plasma chamber 725.

The value of inductor 910 can be selected to control the current fall time. In some embodiments, the inductor 910 can have an inductance value between 1 μH-500 μH.

In some embodiments, the energy recovery circuit 905 may include a switch that can be used to control the flow of current through the inductor 910. The switch, for example, may be placed in series with the inductor 910

A switch in the energy recovery circuit 905, for example, may include a high voltage switch such as, for example, the high voltage switch disclosed in U.S. patent application Ser. No. 16/178,565 filed Nov. 1, 2018, titled "HIGH VOLTAGE SWITCH WITH ISOLATED POWER," which claims priority to U.S. Provisional Patent Application No. 62/717,637 filed Aug. 10, 2018, both of which are incorporated by reference in the entirety. In some embodiments, the RF source 805 may include a high voltage switch in place of or in addition to the various components shown in RF source 805.

Figure 10:
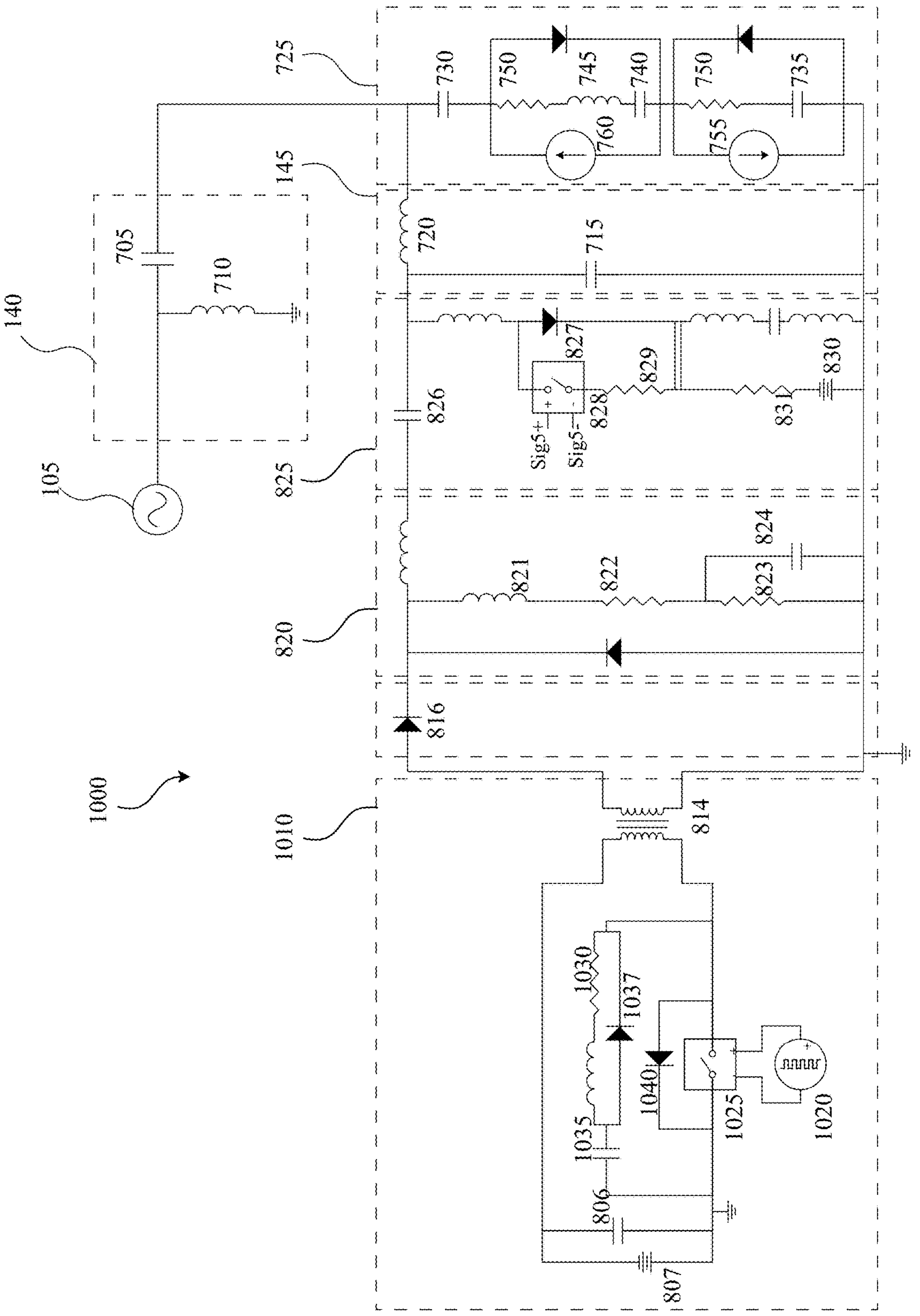
FIG. 10 is an example circuit diagram of a filtered RF driver and a nanosecond pulser according to some embodiments.

FIG. 10 is a circuit diagram of a nanosecond pulser 1000 driving a plasma within the plasma chamber 725 according to some embodiments. In this example, the nanosecond pulser 1000 is one example of a nanosecond pulser 115. The nanosecond pulser 1000 may be coupled with the RF driver 105 and the filter 140. In this example, the nanosecond pulser 1000 may include pulser stage 1010, a resistive output stage 820, and/or a bias compensation circuit 825.

In some embodiments, the nanosecond pulser 1000 (or the pulser stage 1010) can introduce pulses into the load stage with voltages greater than 1 kV, 10 kV, 20 kV, 50 kV, 100 kV, 1,000 kV, etc., with rise times less than about 1 ns, 10 ns, 50 ns, 100 ns, 250 ns, 500 ns, 1,000 ns, etc. with fall times less than about 1 ns, 10 ns, 50 ns, 100 ns, 250 ns, 500 ns, 1,000 ns, etc. and frequencies greater than about 1 kHz, 10 kHz, 100 kHz, 200 kHz, 500 kHz, 1 MHz, etc.

In some embodiments, the pulser stage 1010, for example, may include any device capable of producing pulses greater than 500 V, peak current greater than 10 Amps, or pulse widths of less than about 10,000 ns, 1,000 ns, 100 ns, 10 ns, etc. As another example, the pulser stage 1010 may produce pulses with an amplitude greater than 1 kV, 5 kV, 10 kV, 50 kV, 200 kV, etc. As another example, the pulser stage 1010 may produce pulses with rise times or fall times less than about 5 ns, 50 ns, or 300 ns, etc.

In some embodiments, the pulser stage 1010 can produce a plurality of high voltage bursts. Each burst, for example, can include a plurality of high voltage pulses with fast rise times and fast fall times. The plurality of high voltage bursts, for example, can have a burst repetition frequency of about 10 Hz to 10 kHz. More specifically, for example, the plurality of high voltage bursts can have a burst repetition frequency of about 10 Hz, 100 Hz, 250 Hz, 500 Hz, 1 kHz, 2.5 kHz, 5.0 kHz, 10 kHz, etc.

Within each of the plurality of high voltage bursts, the high voltage pulses can have a pulse repetition frequency of about 1 kHz, 10 kHz, 100 kHz, 200 kHz, 500 kHz, 1 MHz, etc.

In some embodiments, the burst repetition frequency time from one burst till the next burst. Frequency at which the bias compensation switch is operated.

In some embodiments, the pulser stage 1010 can include one or more solid state switches 1025 (e.g., solid state switches such as, for example, IGBTs, a MOSFETs, a SiC MOSFETs, SiC junction transistors, FETs, SiC switches, GaN switches, photoconductive switches, etc.) coupled with a voltage source 1020. In some embodiments, the pulser stage 1010 can include one or more source snubber resistors 1030, one or more source snubber diodes 1037, one or more source snubber capacitors 1035, or one or more source freewheeling diodes 1040. One or more switches and or circuits can be arranged in parallel or series.

In some embodiments, the pulser stage 1010 can produce a plurality of high voltage pulses with a high frequency, fast rise times, fast fall times, at high frequencies, etc. The pulser stage 1010 may include one or more nanosecond pulsers.

In some embodiments, the pulser stage 1010 may comprise a high voltage pulsing power supply.

The pulser stage 1010 may, for example, include any pulser described in U.S. patent application Ser. No. 14/542,487, titled "High Voltage Nanosecond Pulser," which is incorporated into this disclosure in its entirety for all purposes. The pulser stage 1010 may, for example, include any pulser described in U.S. Pat. No. 9,601,283, titled "Efficient IGBT Switching," which is incorporated into this disclosure in its entirety for all purposes. The pulser stage 1010 may, for example, include any pulser described in U.S. patent application Ser. No. 15/365,094, titled "High Voltage Transformer," which is incorporated into this disclosure in its entirety for all purposes.

The pulser stage 1010 may, for example, include a high voltage switch. As another example, the pulser stage 1010 may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the pulser stage 1010 can include a transformer 814. The transformer 814 may include a transformer core (e.g., a toroid or non-toroid core); at least one primary winding wound once or less than once around the transformer core; and a secondary winding wound around the transformer core a plurality of times.

In some embodiments, the transformer 814 may include a single-turn primary winding and a multi-turn secondary windings around a transformer core. The single-turn primary winding, for example, may include one or more wires wound one or fewer times around a transformer core. The single-turn primary winding, for example, may include more than 2, 10, 20, 50, 100, 250, 1200, etc. individual single-turn primary windings. In some embodiments, the primary winding may include a conductive sheet.

The multi-turn secondary winding, for example, may include a single wire wound a plurality of times around the transformer core. The multi-turn secondary winding, for example, may be wound around the transformer core more than 2, 10, 25, 50, 100, 250, 500, etc. times. In some embodiments, a plurality of multi-turn secondary windings may be wound around the transformer core. In some embodiments, the secondary winding may include a conductive sheet.

In some embodiments, the high-voltage transformer may be used to output a voltage greater than 1,000 volts with a fast rise time of less than 150 nanoseconds or less than 50 nanoseconds, or less than 5 ns.

In some embodiments, the high-voltage transformer may have a low impedance and/or a low capacitance. For example, the high-voltage transformer has a stray inductance of less than 100 nH, 50 nH, 30 nH, 20 nH, 10 nH, 2 nH, 100 pH as measured on the primary side and/or the transformer has a stray capacitance of less than 100 pF, 30 pF, 10 pF, 1 pF as measured on the secondary side.

The transformer 814 may comprise a transformer as disclosed in U.S. patent application Ser. No. 15/365,094, titled "High Voltage Transformer," which is incorporated into this document for all purposes.

Figure 11:
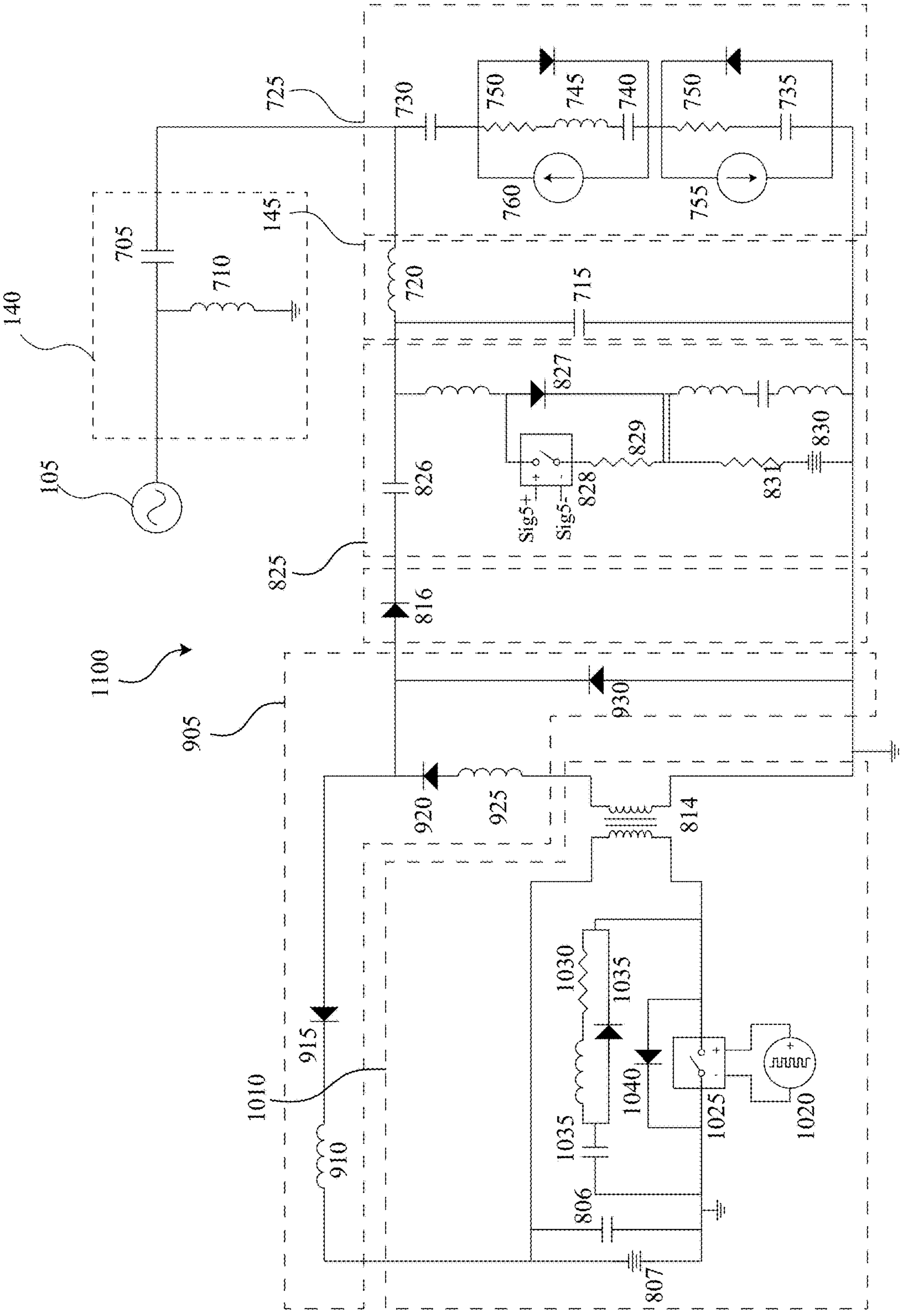
FIG. 11 is an example circuit diagram of a filtered RF driver and a nanosecond pulser according to some embodiments.

FIG. 11 is a circuit diagram of a nanosecond pulser 1100 driving a plasma within the plasma chamber 725 according to some embodiments. In this example, the nanosecond pulser 1000 is one example of a nanosecond pulser 115. The nanosecond pulser 1100 may be coupled with the RF driver 105 and the filter 140. In this example, the nanosecond pulser 1100 may include pulser stage 1010, an energy recovery circuit 905, and/or a bias compensation circuit 825. Various other circuit elements may be included. Various other circuit elements may be included.

The nanosecond pulser 1100 is similar to the nanosecond pulser 1000 but without the resistive output stage 820 and includes an energy recovery circuit 905. In some embodiments, the energy recovery circuit 905 and/or the bias compensation circuit 825 may be optional.

In this example, the energy recovery circuit 905 may be positioned on or electrically coupled with the secondary side of the transformer 814. The energy recovery circuit 905, for example, may include a diode 930 (e.g., a crowbar diode) across the secondary side of the transformer 814. The energy recovery circuit 905, for example, may include diode 915 and inductor 910 (arranged in series), which can allow current to flow from the secondary side of the transformer 814 to charge the power supply 806 and current to flow to the plasma chamber 725. The diode 915 and the inductor 910 may be electrically connected with the secondary side of the transformer 814 and coupled with the power supply 806. The diode 915 and the inductor 910 may be arranged in any order. In some embodiments, the energy recovery circuit 905 may include diode 920 and/or inductor 925 electrically coupled with the secondary of the transformer 814. The inductor 910 may represent the stray inductance and/or may include the stray inductance of the transformer 814.

When the RF source 805 is turned on, current may charge the plasma chamber 725 (e.g., charge the capacitor 735, capacitor 730, or capacitor 740). Some current, for example, may flow through inductor 910 when the voltage on the secondary side of the transformer 814 rises above the charge voltage on the power supply 806. When the nanosecond pulser is turned off, current may flow from the capacitors within the plasma chamber 725 through the inductor 910 to charge the power supply 806 until the voltage across the inductor 910 is zero. The diode 930 may prevent the capacitance within the plasma chamber 725 from ringing with the inductance in the plasma chamber 725 or the bias compensation circuit 825.

The diode 915 may, for example, prevent charge from flowing from the power supply 806 to the capacitors within the plasma chamber 725.

The inductance value of inductor 910 can be selected to control the current fall time. In some embodiments, the inductor 910 can have an inductance value between 1 μH-500 μH.

In some embodiments, the energy recovery circuit 905 may include a switch that can be used to control the flow of current through the inductor 910. The switch, for example, may be placed in series with the inductor 910.

A switch in the energy recovery circuit 905, for example, may include a high voltage switch such as, for example, the high voltage switch disclosed in U.S. patent application Ser. No. 16/178,565 filed Nov. 1, 2018, titled "HIGH VOLTAGE SWITCH WITH ISOLATED POWER," which claims priority to U.S. Provisional Patent Application No. 62/717,637 filed Aug. 10, 2018, both of which are incorporated by reference in the entirety.

Figure 12:
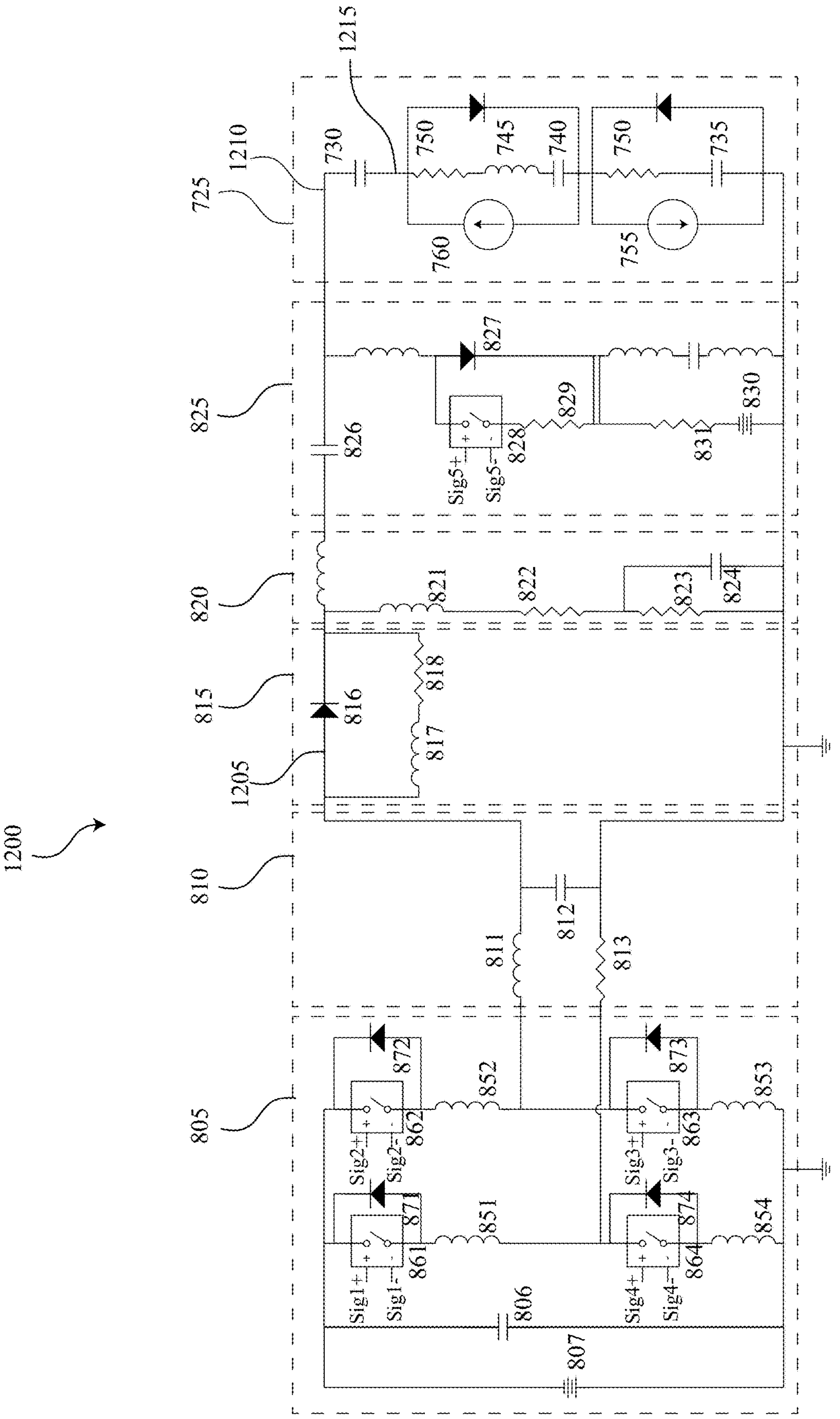
FIG. 12 is an example circuit diagram of a filtered RF driver according to some embodiments.

FIG. 12 is a circuit diagram of an RF driver circuit 1200 driving the plasma chamber 725 according to some embodiments. The RF driver circuit 1200 is similar to RF driver 800. While the transformer 814 is removed, a transformer may be used.

The RF source 805 may drive the resonant circuit 810 at the resonant frequency of the resonant inductor 811, resonant capacitor 812, and/or resonant resistor 813.

Figure 13:
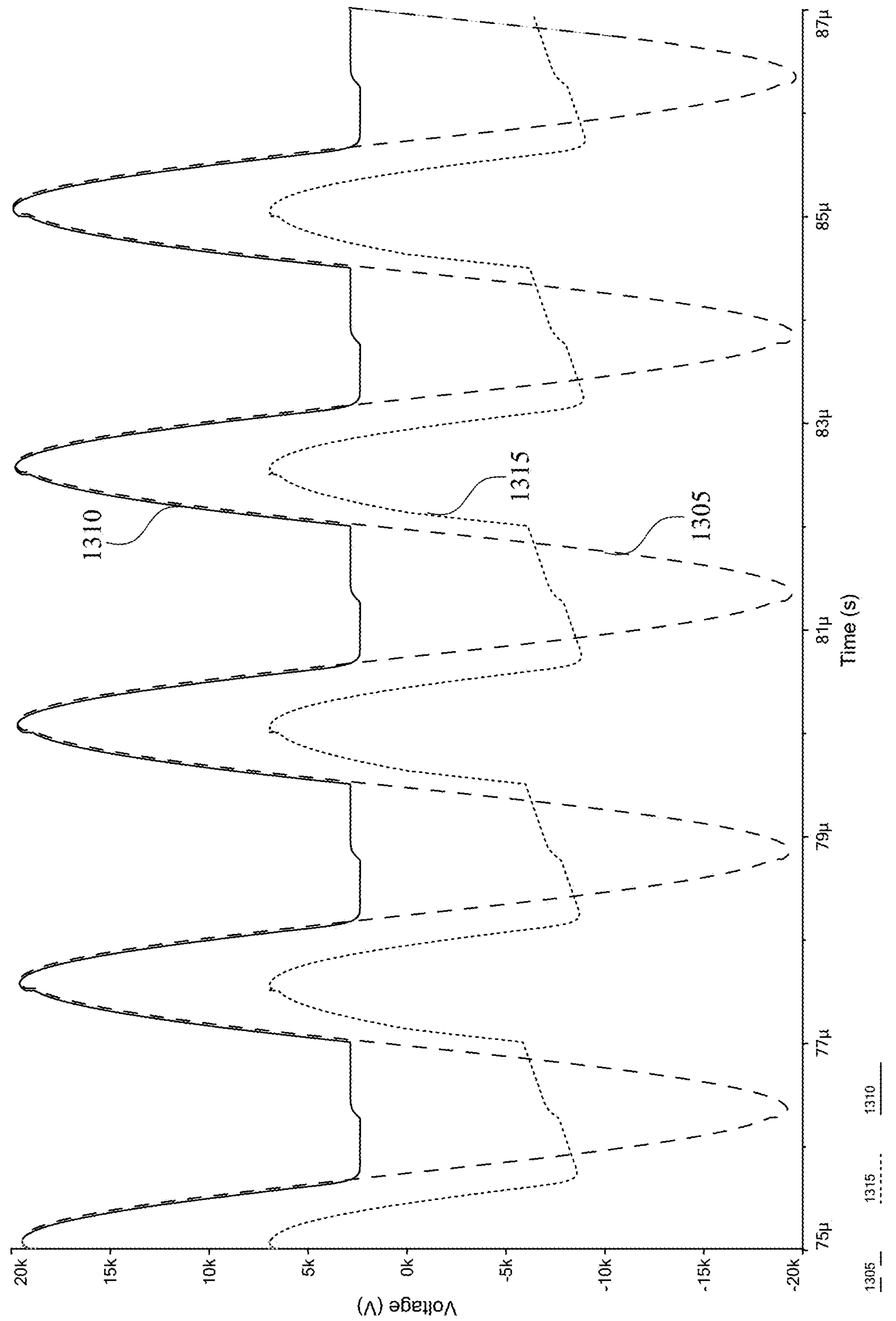
FIG. 13 illustrates waveforms produced by an RF driver.

The rectifying diode 816 (without droop control inductor 817 and droop control resistor 818) may rectify the sinusoidal waveform produced by the RF source 805 and the resonant circuit 810 as shown in waveform 1310 of FIG. 13, which shows the voltage measured over time at point 1210. The result on the wafer is shown in waveform 1315, which shows the voltage measured over time at point 1215. The voltage produced by the RF source 805 and the resonant circuit 810 is shown in waveform 1305. The flat portion of waveform 1315 has some negative going droop. Droop is the non-flat portion of the waveform caused by the ion current in the plasma. In this example, the droop is an upward sloping of the portion of waveform 1315 shown from approximately 8 kV sloping up to 5 kV. In some embodiments, it may be beneficial to have this portion of the waveform 1310 remain at near constant voltage as this is directly correlated to ion energy falling to the wafer surface.

The proper selection of the droop control inductor 817 and the droop control resistor 818 based on the RF frequency, RF voltage and ion current to the wafer can compensate for the droop in waveform 1315. The droop control inductor 817 and the droop control resistor 818 may allow for some portion of the negative portion of the resonant sinewave to flow to point 1210, which replaces the loss charge on capacitor 730 due to ion current flowing to point 1215. The droop control inductor 817 or the droop control resistor 818 may be replaced by a droop control capacitor or a droop control capacitor may be added. The droop control resistor 818 may include or comprise stray resistance throughout the circuit. The values of the droop control inductor 817 and the droop control resistor 818 may be selected based on the resonant frequency, output resonant voltage amplitude (e.g., of waveform 1305), and/or the amplitude of the ion current on the wafer surface of the resonant circuit 810.

In some embodiments, the droop control inductor 817, the droop control resistor 818, and/or the droop control capacitor may be predetermined or controlled in real time. For example, the droop control inductor 817 may include a variable inductor, the droop control resistor 818 may include a variable resistor, and/or the droop control capacitor may comprise a variable capacitor.

In some embodiments, the impedance of either the droop control resistor 818 and/or the drop control inductor 817 at a given frequency and voltage may be equal to or less than required to balance the discharge rate of capacitor 730.

Figure 14:
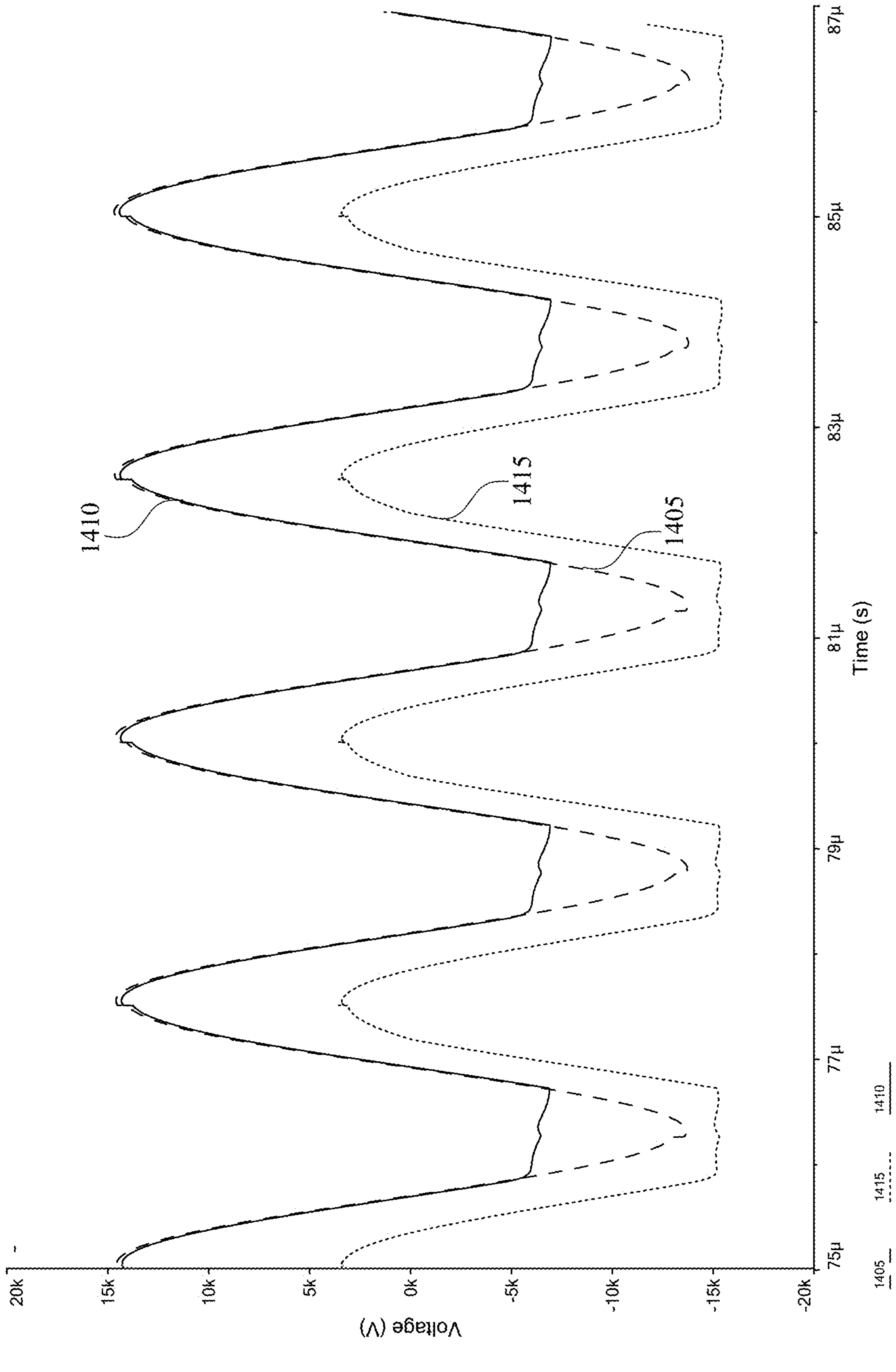
FIG. 14 illustrates waveforms produced by an RF driver.

As shown in waveform 1415 of FIG. 14, the droop on the wafer can be removed with the inclusion of the droop control inductor 817 and the droop control resistor 818. The droop control inductor 817 and the droop control resistor 818 may allow current to flow back through the circuit causing a negative going rectification as shown in the portions of waveform 1410 that should be flat but are otherwise sloping downward. In some embodiments, it may be beneficial to have this portion of the waveform 1410 remain at near constant voltage as this is directly correlated to ion energy falling to the wafer surface.

In some embodiments, the droop control inductor 817 may have an inductance less than about 100 mH, 50 mH, 10 mH, 5 mH, etc. In some embodiments, the drop control inductor 817 may have an inductance less than about 0.1 mH, 0.5 mH, 1 mH, 5 mH, 10 mH, etc.

In some embodiments, the droop control resistor 818 may comprise a resistor or stray resistance that is less than about 10 mΩ, 50 mΩ, 100 mΩ, 250 mΩ, 500 mΩ, etc. In some embodiments, the droop control resistor 818 may comprise a resistor or stray resistance that is less than about 10Ω, 50Ω, 100Ω, 250Ω, 500Ω, etc.

Figure 15:
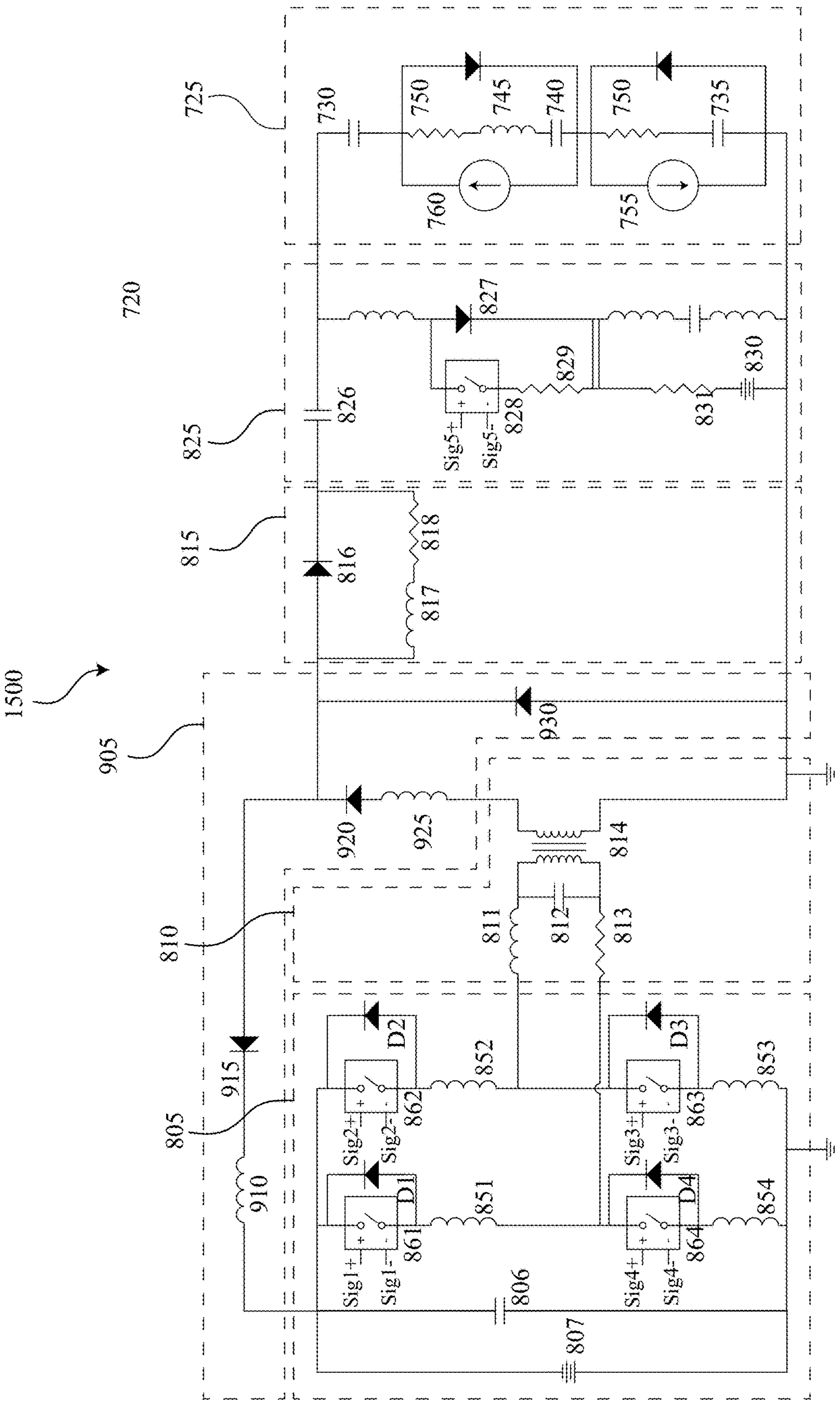
FIG. 15 is an example circuit diagram of a filtered RF driver according to some embodiments.

FIG. 15 is a circuit diagram of an RF driver circuit 1500 driving the plasma chamber 725 according to some embodiments. The RF driver circuit 1500 is similar to RF driver circuit 1200 with the resistive output stage 820 is replaced with an energy recovery circuit 905. The resistive output stage 820 and the energy recovery circuit 905 can be referred to as energy sink circuits. The droop control inductor 817 and droop control resistor 818 may correct for any droop in the circuit.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The term "or" is inclusive.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A plasma system comprising:

a plasma chamber comprising a plurality of walls and a wafer support, when a plasma is created within the plasma chamber a wall-plasma sheath is formed between the plasma and the at least one of the plurality of walls, and a wafer-plasma sheath is formed between the plasma and a wafer disposed on the wafer support;

an RF driver that drives RF bursts into the plasma chamber with an RF frequency greater than about 1 Mhz;

a nanosecond pulser that drives pulses into the plasma chamber with a pulse repetition frequency that is less than the RF frequency and peak voltages greater than about 1 kV, where the pulses produce by the nanosecond pulser are different than the RF bursts produced by the RF driver;

a high pass filter disposed between the RF driver and the plasma chamber that allows the RF bursts to pass into the chamber; and a low pass filter disposed between the nanosecond pulser and the plasma chamber that allows pulses with a pulse repetition frequency less than 1 Mhz into the chamber.

2. The plasma system according to claim 1, wherein a capacitance of the wafer-plasma sheath is less than about 1 nF.

3. The plasma system according to claim 1, wherein a capacitance of the wall-plasma sheath is at least about ten times greater than a capacitance of the wafer-plasma sheath.

4. The plasma system according to claim 1, wherein the high pass filter comprises series capacitance that is less than 10 nF.

5. The plasma system according to claim 4, wherein a capacitor has a capacitance less than about 500 pF.

6. The plasma system according to claim 1, wherein the low pass filter comprises an inductor with an inductance less than about 10 nH.

7. The plasma system according to claim 1, wherein the low pass filter comprises an inductor with a stray capacitance less than about 5 pF.

8. A plasma system comprising:

a plasma chamber comprising a plurality of walls and a wafer support, when a plasma is created within the plasma chamber a wall-plasma sheath is formed between the plasma and the at least one of the plurality of walls, and a wafer-plasma sheath is formed between the plasma and a wafer disposed on the wafer support, wherein a capacitance of the wafer-plasma sheath is less than about 1 nF;

an RF driver that drives RF bursts into the plasma chamber with an RF frequency greater than about 1 Mhz;

a nanosecond pulser that drives pulses into the plasma chamber with a pulse repetition frequency that is less than the RF frequency and peak voltages greater than about 1 kV, where the pulses produce by the nanosecond pulser are different than the RF bursts produced by the RF driver;

a high pass filter disposed between the RF driver and the plasma chamber that allows the RF bursts to pass into the chamber, wherein the high pass filter comprises series capacitance that is less than 10 nF; and a low pass filter disposed between the nanosecond pulser and the plasma chamber that allows pulses with a pulse repetition frequency less than 1 Mhz into the chamber, wherein the low pass filter comprises an inductor with an inductance less than about 10 nH.

* * * * *